(12) United States Patent
Yanagisawa

(10) Patent No.: US 8,823,082 B2
(45) Date of Patent: Sep. 2, 2014

(54) SEMICONDUCTOR DEVICE

(75) Inventor: Makoto Yanagisawa, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 308 days.

(21) Appl. No.: 13/205,671

(22) Filed: Aug. 9, 2011

(65) Prior Publication Data

US 2012/0043542 A1   Feb. 23, 2012

(30) Foreign Application Priority Data

Aug. 19, 2010   (JP) ................. 2010-184118

(51) Int. Cl.
*H01L 29/78*   (2006.01)
*H01L 29/04*   (2006.01)

(52) U.S. Cl.
USPC ............. 257/329; 257/57; 257/192; 257/401; 257/E29.003; 257/E29.255; 257/E29.262; 438/104; 438/156

(58) Field of Classification Search
USPC .................... 257/57, 192, 329, 401, E29.003, 257/E29.255, E29.262; 438/104, 156
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Dao H Nguyen
(74) *Attorney, Agent, or Firm* — Eric J. Robinson; Robinson Intellectual Property Law Office, P.C.

(57) ABSTRACT

The present invention is a semiconductor device including a first electrode over a substrate; a pair of oxide semiconductor films in contact with the first electrode; a second electrode in contact with the pair of oxide semiconductor films; a gate insulating film covering at least the first electrode and the pair of oxide semiconductor films; and a third electrode that is in contact with the gate insulating film and is formed at least between the pair of oxide semiconductor films. When the donor density of the oxide semiconductor films is $1.0 \times 10^{13}/cm^3$ or less, the thickness of the oxide semiconductor films is made larger than the in-plane length of each side of the oxide semiconductor films which is in contact with the first electrode.

24 Claims, 13 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,429,823 B2 | 9/2008 | Yamamoto et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0255647 A1* | 11/2005 | Forbes | 438/216 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0179199 A1 | 7/2009 | Sano et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0142294 A1* | 6/2010 | Carman | 365/191 |
| 2011/0101337 A1 | 5/2011 | Yamazaki | |
| 2011/0101356 A1 | 5/2011 | Yamazaki | |
| 2011/0108909 A1* | 5/2011 | Weng et al. | 257/329 |
| 2011/0121284 A1 | 5/2011 | Yamazaki et al. | |
| 2011/0121288 A1 | 5/2011 | Yamazaki et al. | |
| 2011/0127522 A1 | 6/2011 | Yamazaki | |
| 2011/0127526 A1 | 6/2011 | Kawae et al. | |
| 2012/0208318 A1* | 8/2012 | Hoffman et al. | 438/104 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 63-296378 | 12/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2003-110110 | 4/2003 | |
| JP | 2003-298062 | 10/2003 | |
| JP | 2004-103957 A | 4/2004 | |
| JP | 2004-273614 A | 9/2004 | |
| JP | 2004-273732 A | 9/2004 | |
| JP | 2007-096055 | 4/2007 | |
| JP | 2007-123861 | 5/2007 | |
| WO | WO-2004/114391 | 12/2004 | |
| WO | 2006/051993 | 5/2006 | |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7,8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composite for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display

(56) References Cited

OTHER PUBLICATIONS

Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and SC2O3—A2O3—BO Systems [A; Fe, Ga, or Al: B: Mg, Mn, Fe, Ni, Cu, or Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE

BACKGROUND OF THE INVENTION

1. Field of the Invention

Field of the Invention relates to a semiconductor device using an oxide semiconductor.

In this specification, the term semiconductor device refers to all devices that can function by utilizing semiconductor characteristics. Electrooptic devices, semiconductor circuits, and electronic devices are all semiconductor devices.

2. Description of the Related Art

In recent years, transistors are used for many liquid crystal display devices and light-emitting display devices typified by flat panel displays, and they are formed with silicon semiconductors, such as amorphous silicon or polycrystalline silicon, over a glass substrate.

Attention has been directed to a technique in which, instead of such silicon semiconductors, oxide semiconductors are used for transistors.

Examples of the oxide semiconductor include zinc oxide, which is one-metal oxide, and In—Ga—Zn—O-based oxide, which is a homologous compound. Patent Documents 1 and 2 disclose techniques in which such an oxide semiconductor is used to form transistors as switching elements and the like in pixels of a display device.

REFERENCE

[Patent Document 1] Japanese Published Patent Application No. 2007-123861
[Patent Document 2] Japanese Published Patent Application No. 2007-96055

SUMMARY OF THE INVENTION

Bottom-gate transistors which are a kind of lateral transistors and used as pixel switching elements for such display devices are not suitable for use of high power. This is because in order to use a bottom-gate transistor for use of high power, its semiconductor film thickness and channel width need to be increased, so that an area occupied by the bottom-gate transistor is increased. For this reason, a transistor used in a semiconductor device for use of high power is required to occupy a small area and have a structure that produces a high drain current and high drain breakdown voltage.

Although the use of vertical transistors for use of high power is also considered, vertical transistors have difficulty having favorable transistor characteristics, e.g., they cannot have the ON/OFF ratio of drain current.

In view of this, it is the object of one embodiment of the present invention to provide a semiconductor device having favorable electric characteristics.

In view of the above object, one embodiment of the present invention provides a semiconductor device including: a first electrode; a pair of oxide semiconductor films in contact with the first electrode; a second electrode overlapping with the first electrode with the pair of oxide semiconductor films interposed therebetween; a gate insulating film covering at least the first electrode and the pair of oxide semiconductor films; and a third electrode that is in contact with the gate insulating film and is formed at least between the pair of oxide semiconductor films.

In the above-stated semiconductor device, the first electrode serves as one of a source electrode and a drain electrode, the second electrode serves as the other of the source electrode and the drain electrode, and the third electrode serves as a gate electrode.

In addition, a plurality of oxide semiconductor films can be used as channel formation regions instead of the pair of oxide semiconductor films.

In other words, one embodiment of the present invention provides a semiconductor device including: a first electrode; a plurality of oxide semiconductor films in contact with the first electrode; a second electrode overlapping with the first electrode with the plurality of oxide semiconductor films interposed therebetween; a gate insulating film covering at least the first electrode and the plurality of oxide semiconductor films; and a third electrode that is in contact with the gate insulating film and is formed at least between the plurality of oxide semiconductor films.

For the above-stated semiconductor device, the third electrode may have a closed-loop structure, and the third electrode may face all the sidewalls of the oxide semiconductor films with the gate insulating film interposed therebetween.

For the above-stated semiconductor device, the oxide semiconductor film shape that provides favorable transistor characteristics (the thickness, in particular) is dependent on the carrier density, which depends on donors in the oxide semiconductor film.

When the donor density of the oxide semiconductor films is $1.0 \times 10^{13}/cm^3$ or less, the thickness of the oxide semiconductor films is preferably set 9 times or more as large as the length of each side of the oxide semiconductor films which is in contact with the first electrode.

When the donor density of the oxide semiconductor films is more than $1.0 \times 10^{13}/cm^3$, the thickness of the oxide semiconductor films is preferably set 11 times or more as large as the length of each side of the oxide semiconductor films which is in contact with the first electrode.

One embodiment of the present invention can provide a semiconductor device having favorable electric characteristics.

DETAILED DESCRIPTION OF THE INVENTION

Figure 1A:
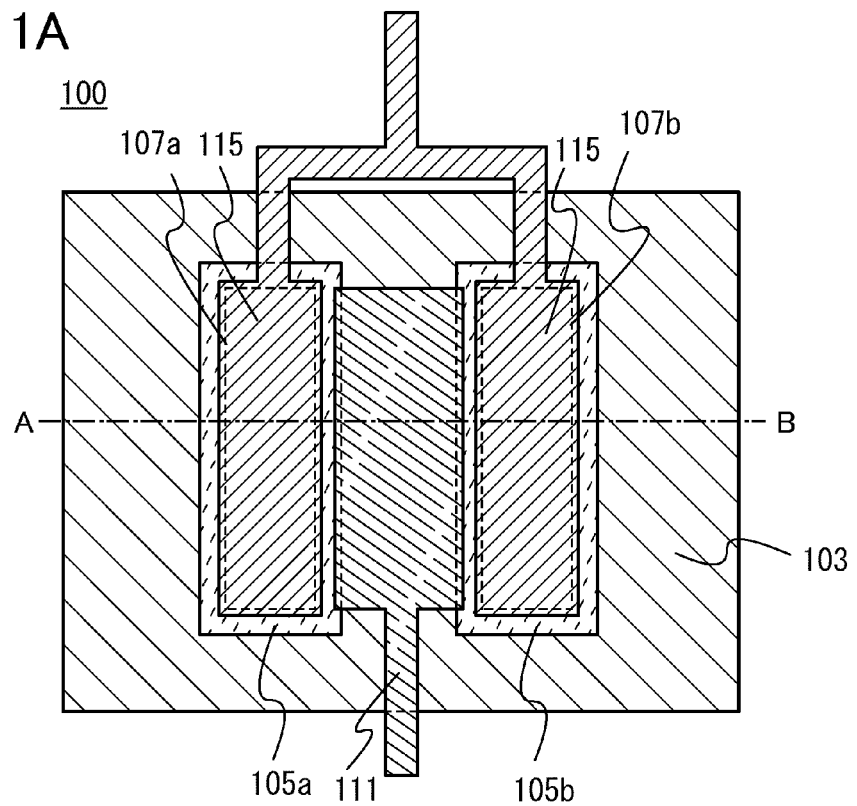
FIG. 1A is a top view of a vertical transistor and FIG. 1B is a cross-sectional view thereof.

Hereinafter, embodiments of the present invention will be described in detail with reference to the accompanying drawings. However, the present invention is not limited to the following description and it is easily understood by those skilled in the art that the mode and details can be variously changed without departing from the spirit and the scope of the present invention. Therefore, the invention should not be construed as being limited to the description of the embodiments below. In describing structures of the present invention with reference to the drawings, components common between different drawings maintain the same reference numerals. The same hatching pattern is applied to similar parts, and the similar parts are not especially denoted by reference numerals in some cases. In addition, an insulating layer is not illustrated in a top view for convenience in some cases. Note that the size, the layer thickness, or the region of each structure illustrated in the drawings might be exaggerated for the sake of clarity. Therefore, the present invention is not necessarily limited to the illustrated scales.

Note that, functions of "source" and "drain" might be interchanged, for example when the direction of a current flow is changed in circuit operation. Therefore, the terms "source" and "drain" can be replaced with each other in this specification.

On-current refers to a current which flows between a source electrode and a drain electrode when a transistor is on (also referred to as drain current and abbreviated to Id), e.g., in the case of an n-channel transistor, the on-current refers to a drain current which flows between a source electrode and a drain electrode when the gate voltage (Vgs or Vg) that corresponds to a potential difference obtained by subtracting the gate electrode potential from the source electrode potential is higher than the threshold voltage of the transistor. In addition, off-current refers to a drain current which flows between a source electrode and a drain electrode when a transistor is off, e.g., in the case of an n-channel transistor, the off current refers to a drain current which flows between a source electrode and a drain electrode when the gate voltage is lower than the threshold voltage of the transistor. On/off ratio is a ratio of on-current and off-current.

Embodiment 1

In this embodiment, a transistor in one embodiment of the present invention will be described.

Figure 1B:
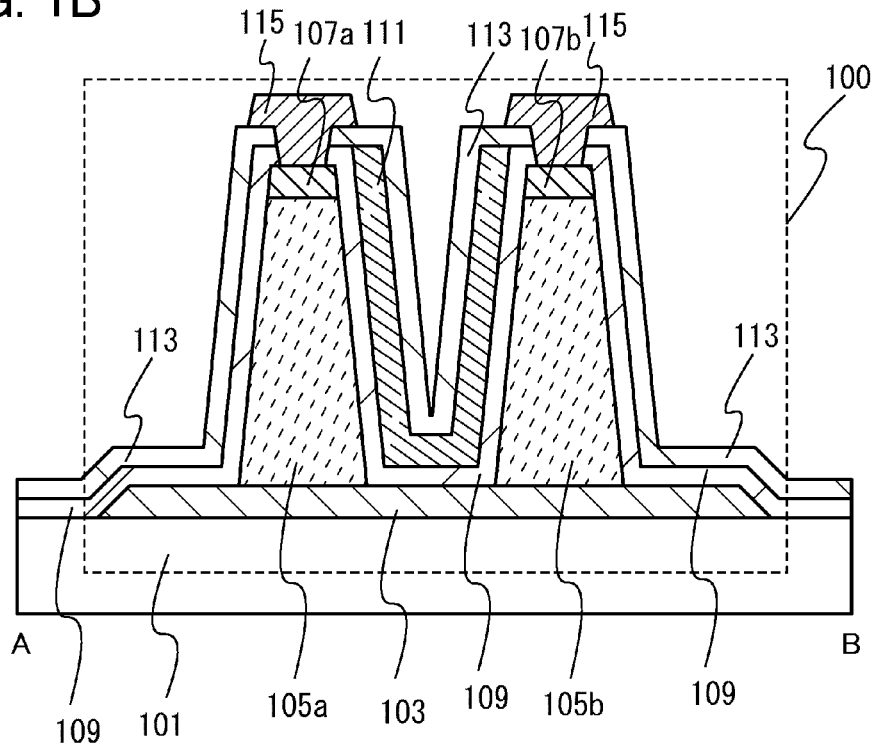

FIG. 1A is a top view of a transistor 100, and FIG. 1B is a cross-sectional view taken along line A-B in FIG. 1A.

The transistor 100 includes a first electrode 103 over a substrate 101; oxide semiconductor films 105a and 105b serving as channel formation regions; second electrodes 107a and 107b overlapping with the first electrode 103 with the oxide semiconductor films 105a and 105b interposed therebetween; a gate insulating film 109 covering the elements given so far; a third electrode 111 between a pair of oxide semiconductor films 105a and 105b; an interlayer insulating film 113 covering the elements given so far; and wiring 115 in contact with the second electrodes 107a and 107b. Although not illustrated, a base insulating film may be between the substrate 101 and the first electrode 103.

Examples of the functions of the electrodes are as follows: the first electrode may function as one of a source electrode and a drain electrode, the second electrode as the other of the source electrode and the drain electrode, and the third electrode as a gate electrode.

FIG. 1A does not illustrate the substrate 101, the gate insulating film 109, and the interlayer insulating film 113 for simplicity. FIG. 1A illustrates the oxide semiconductor films 105a and 105b serving as channel formation regions which are over the first electrode 103 serving as one of the source electrode and the drain electrode; the wiring 115 over the second electrodes 107a and 107b each serving as the other of the source electrode and the drain electrode; and the third electrode 111 serving as a gate electrode and being between the oxide semiconductor films 105a and 105b. The wiring 115 is bifurcated so that the second electrodes 107a and 107b may be at the same potential. Here, the third electrode 111 including lead wiring is used; alternatively, separate lead wiring may be electrically connected to the third electrode. Although not illustrated, lead wiring may also be included in the first electrode 103.

The transistor 100 is a vertical transistor in which the channel formation region is formed in the thickness direction as a result of the third electrode and drain current flows between the first electrode and the second electrode in the thickness direction.

A vertical transistor occupies a smaller area than a lateral transistor, and thus can be reduced in size more easily. The transistor 100 has a structure in which a plurality of current paths (channel formation regions) is connected in parallel. Consequently, the transistor 100 can achieve both its size reduction and output current per unit area higher than that of a lateral transistor.

In order to have a high drain current, a transistor for use of high power preferably has a large channel width. The substantial channel width of the transistor 100 corresponds to the sum of the lengths of the oxide semiconductor films 105a and 105b perpendicular to line A-B in FIG. 1A. An example of a transistor that can have a drain current equal to that of the transistor 100 is a vertical transistor having one oxide semiconductor film with a channel width equal to the substantial channel width of the transistor 100 (the sum of the lengths of the oxide semiconductor films 105a and 105b). Such a transistor is referred to as a vertical transistor_A for convenience.

For a vertical transistor, which can easily be reduced in size, the gate electrode width (line width) is reduced as the transistor is reduced in size for the purpose of increasing the scale of integration. In other words, in a structure of a transistor with a large channel width such as the vertical transistor_A, the width (line width) of a gate electrode is reduced and the length of the gate electrode is increased according to the large channel width, so that wiring resistance in the gate electrode is increased. The increased wiring resistance causes wiring delay, which reduces the operating speed of the vertical transistor. This leads to an increase in the length of time for the switching between the on state and off state of the transistor, thereby increasing the loss of power due to the switching.

A transistor for use of high power is known to particularly involve significant power loss during the switching that increases with the switching time, and thus preferably has a short switching time.

In view of this, the transistor 100 has oxide semiconductor films arranged in parallel, so that it can have both a substantially large channel width and a gate electrode length smaller than that of the vertical transistor_A. This reduces a drop in the operating speed of the transistor 100 and prevents the increase in the switching time of the transistor 100, thereby producing a high drain current without increasing the power loss during the switching.

Next, a transistor 200 having the third electrode 111 different from that of the transistor 100 will be described.

Figure 2A:
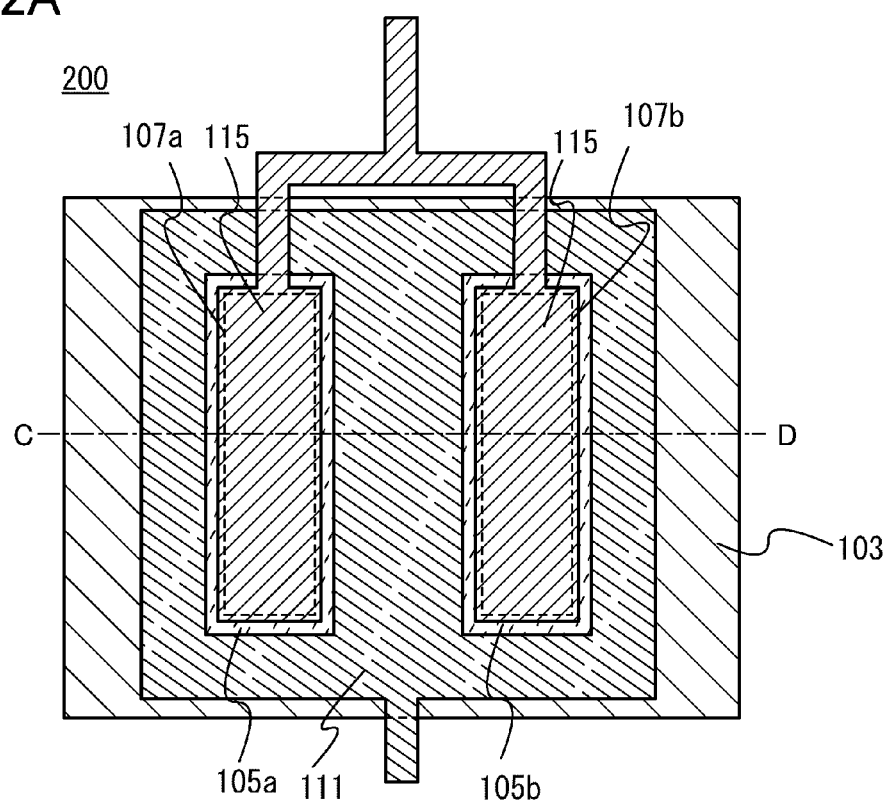
FIG. 2A is a top view of a vertical transistor and FIG. 2B is a cross-sectional view thereof.
Figure 2B:
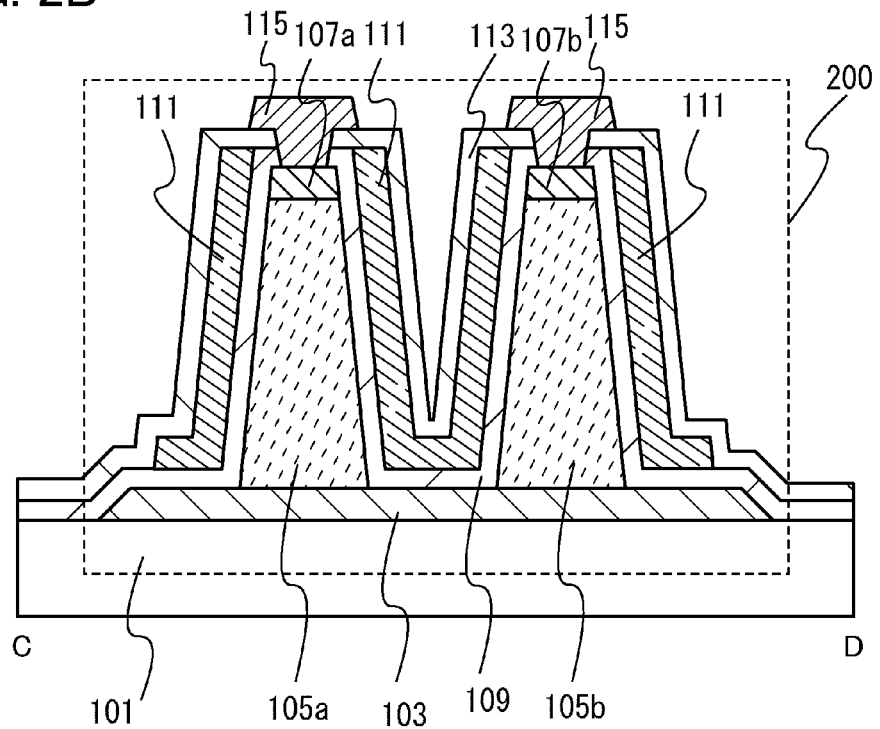

FIG. 2A is a top view of a transistor 200, and FIG. 2B is a cross-sectional view taken along line C-D in FIG. 2A.

The transistor 200 is a vertical transistor like the transistor 100 and includes the first electrode 103 over the substrate 101; the oxide semiconductor films 105*a* and 105*b* serving as channel formation regions; the second electrodes 107*a* and 107*b* overlapping with the first electrode 103 with the oxide semiconductor films 105*a* and 105*b* interposed therebetween; the gate insulating film 109 covering the elements given so far; the third electrode 111 facing all the sidewalls of a pair of oxide semiconductor films 105*a* and 105*b* with the gate insulating film 109 interposed therebetween; the interlayer insulating film 113 covering the first electrode 103, the oxide semiconductor films 105*a* and 105*b*, the second electrodes 107*a* and 107*b*, the gate insulating film 109, and the third electrode 111; and the wiring 115 in contact with the second electrodes. The transistor 200 is different from the transistor 100 in that its third electrode 111 faces all the sidewalls of the oxide semiconductor films 105*a* and 105*b*, which serve as channel formation regions, with the gate insulating film 109 interposed therebetween.

Although not illustrated, a base insulating film may be between the substrate 101 and the first electrode 103.

FIG. 2A does not illustrate the substrate 101, the gate insulating film 109, and the interlayer insulating film 113 for simplicity. The third electrode 111 in FIG. 2A is formed so as to enclose the oxide semiconductor films 105*a* and 105*b*. Except for this, the transistor in FIG. 2A is the same as that in FIG. 1A.

As the transistor 100, the transistor 200 has a structure in which a plurality of current paths (channel formation regions) is connected in parallel. Consequently, the transistor 200 can achieve both its size reduction and output current per unit area higher than that of a lateral transistor.

Further, the transistor 200 has the third electrode 111 facing all the sidewalls of the oxide semiconductor films 105*a* and 105*b* with the gate insulating film 109 interposed therebetween, and thus allows electric field to be efficiently applied to the oxide semiconductor films 105*a* and 105*b*, which serve as channel formation regions, and can have favorable transistor characteristics such as high drain current. For this reason, the transistor 200 is preferable.

Moreover, like the transistor 100, the transistor 200 has the plurality of oxide semiconductor films arranged in parallel, and thus can have a high drain current without reducing the operating speed.

Further, a transistor in one embodiment of the present invention may have a plurality of oxide semiconductor films which serve as channel formation regions, instead of a pair of oxide semiconductor films. An example of a transistor having a plurality of oxide semiconductor films will be now described.

Figure 3A:
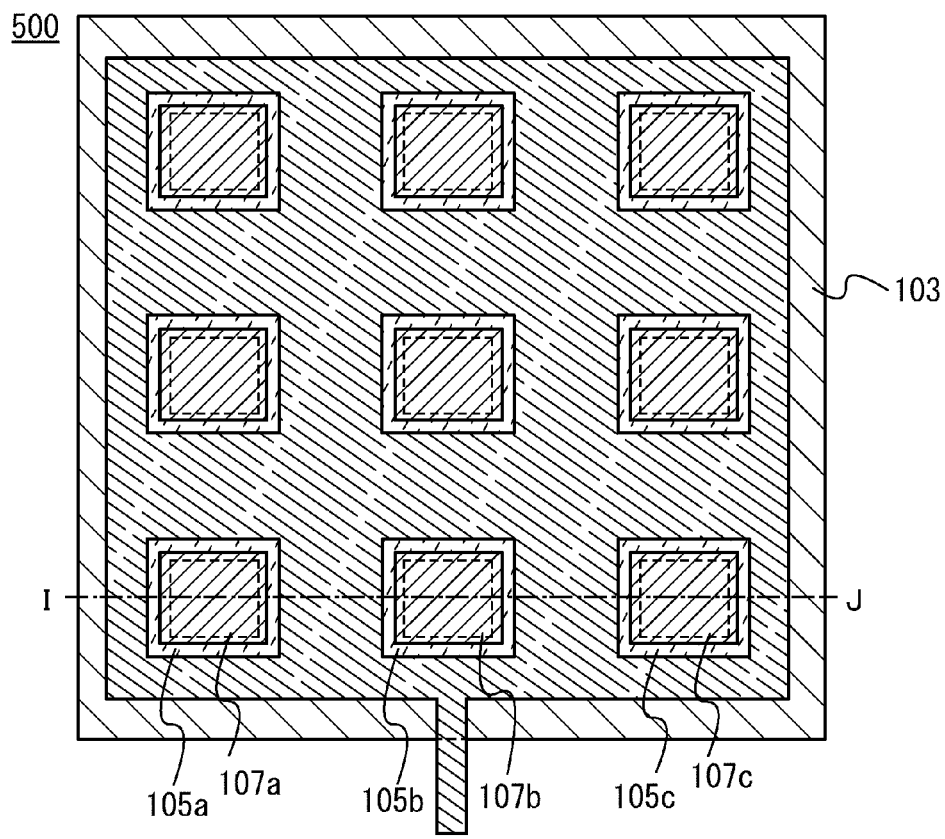
FIG. 3A is a top view of a vertical transistor and FIG. 3B is a cross-sectional view thereof.
Figure 3B:
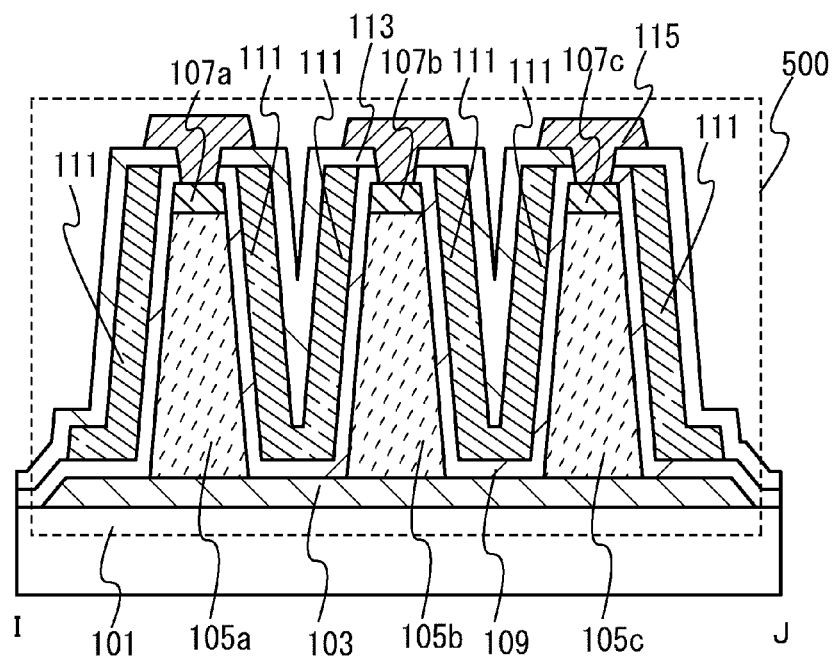

FIG. 3A is a top view of a transistor 500, and FIG. 3B is a cross-sectional view taken along line I-J in FIG. 3A.

The transistor 500 in FIG. 3B includes the first electrode 103 over the substrate 101; a plurality of oxide semiconductor films 105*a*, 105*b*, and 105*c* which serve as channel formation regions; a plurality of second electrodes 107*a*, 107*b*, and 107*c* which overlap with the first electrode 103 with the oxide semiconductor films 105*a*, 105*b*, and 105*c* interposed therebetween; the gate insulating film 109 covering the elements given so far; the third electrode 111 facing all the sidewalls of the oxide semiconductor films 105*a*, 105*b*, and 105*c* with the gate insulating film 109 interposed therebetween; the interlayer insulating film 113 covering the elements given so far; and the wiring 115 in contact with the second electrodes.

In addition, the third electrode 111 faces all the sidewalls of the plurality of oxide semiconductor films, which serve as channel formation regions, with the gate insulating film 109 interposed therebetween. As a result, the third electrode 111 is formed so as to enclose the plurality of oxide semiconductor films. In other words, as illustrated in FIG. 3A, the transistor 500 has the third electrode 111 which has a closed-loop structure. Here, the third electrode 111 including lead wiring is used; alternatively, separate lead wiring may be electrically connected to the third electrode. Although not illustrated, lead wiring may also be included in the first electrode 103.

Note that FIG. 3A does not illustrate the substrate 101, the gate insulating film 109, the interlayer insulating film 113, and the wiring 115 for convenience. Although not illustrated in FIGS. 3A and 3B, a base insulating film may be between the substrate 101 and the first electrode 103.

As the transistor 100, the transistor 500 has a structure in which a plurality of current paths (channel formation regions) is connected in parallel. Consequently, the transistor 500 can achieve both its size reduction and output current per unit area higher than that of a lateral transistor.

Further, the transistor 500 has the third electrode 111 facing all the sidewalls of the plurality of oxide semiconductor films with the gate insulating film 109 interposed therebetween, and thus allows electric field to be efficiently applied to the plurality of oxide semiconductor films, and can have favorable transistor characteristics such as high drain current. For this reason, the transistor 500 is preferable.

Moreover, as the transistor 100, the transistor 500 has the plurality of oxide semiconductor films disposed in parallel, and thus can have a high drain current without reducing the operating speed.

A method for manufacturing the transistor in this embodiment will be described below taking the transistor 100 as an example.

There is no particular limitation on the substrate 101 as long as it can withstand a subsequent manufacturing process. Examples of the substrate that can be used as the substrate 101 include an insulating substrate such as a glass substrate, a ceramic substrate, a quartz substrate, or a sapphire substrate; a semiconductor substrate of a semiconductor material such as silicon; a conductive substrate of a conductor such as metal or stainless steel; and a semiconductor substrate or conductive substrate whose surface is covered with an insulating material. Note that the semiconductor substrate, the conductive substrate, and the semiconductor substrate or conductive substrate whose surface is covered with the insulating material are preferably used in the case where heat treatment at high temperature is performed in the steps for manufacturing the transistor.

A glass substrate whose strain point is 730° C. or more is preferably used in the case where heat treatment at high temperatures is performed in the steps for manufacturing the transistor. The glass substrate is, for example, of a glass material such as aluminosilicate glass, aluminoborosilicate glass, or barium borosilicate glass is used. A glass substrate containing more barium oxides (BaO) than boric oxides can be more practical heat-resistant glass. Therefore, it is preferable to use a glass substrate containing more BaO than $B_2O_3$.

When a base insulating film (not illustrated) is provided between the substrate 101 and the first electrode 103, the base insulating layer can not only prevent diffusion of an impurity element from the substrate 101, but also prevent etching of the substrate during an etching step included in the process for manufacturing the transistor. This is why the thickness of the base insulating layer is preferably, but not limited to, 50 nm or more. Note that the base insulating film may be similar one to a gate insulating film or interlayer insulating film described later. Aluminum nitride, aluminum nitride oxide, and silicon nitride which have a high thermal conductivity are particularly effective in improving thermal dissipation when used for the base insulating film.

The first electrode 103 serving as one of the source electrode and the drain electrode is formed using a metal element selected from aluminum, chromium, copper, tantalum, titanium, molybdenum, tungsten, and yttrium; an alloy containing any of these metal elements as a component; an alloy containing any of these metal elements in combination; or the like. Alternatively, the first electrode 103 may be formed using one or more metal elements selected from manganese, magnesium, zirconium, beryllium, and thorium. In addition, the first electrode 103 can have a single-layer structure or a stacked structure having two or more layers. For example, a single-layer structure of an aluminum film containing silicon, a two-layer structure of an aluminum film overlaid by a titanium film, a two-layer structure of a tungsten film overlaid by a titanium film, a three-layer structure of a titanium film overlaid by an aluminum film overlaid by a titanium film, and the like can be given. Alternatively, a film or an alloy film which contains aluminum and one or more elements selected from titanium, tantalum, tungsten, molybdenum, chromium, neodymium, and scandium may be used. Alternatively, a crystalline silicon film such as polycrystalline silicon may be used.

The first electrode 103 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The first electrode 103 can have a stacked-layer structure formed using the above light-transmitting conductive material and the above metal element.

The thickness of the first electrode is not particularly limited and can be determined as appropriate in consideration of electrical resistance of the conductive film formed with a metal material, an alloy material, or another compound and the time the formation step takes. For example, the first electrode can be formed to a thickness of 10 nm to 500 nm.

The oxide semiconductor films 105a and 105b which are over the first electrode 103 and serve as channel formation regions can each be formed using any of the following: quaternary metal oxides such as In—Sn—Ga—Zn-based metal oxides; ternary metal oxides such as In—Ga—Zn-based metal oxides, In—Sn—Zn-based metal oxides, In—Al—Zn-based metal oxides, Sn—Ga—Zn-based metal oxides, Al—Ga—Zn-based metal oxides, Sn—Al—Zn-based metal oxides, In—Hf—Zn-based metal oxides, In—La—Zn-based metal oxides, In—Ce—Zn-based metal oxides, In—Pr—Zn-based metal oxides, In—Nd—Zn-based metal oxides, In—Sm—Zn-based metal oxides, In—Eu—Zn-based metal oxides, In—Gd—Zn-based metal oxides, In—Tb—Zn-based metal oxides, In—Dy—Zn-based metal oxides, In—Ho—Zn-based metal oxides, In—Er—Zn-based metal oxides, In—Tm—Zn-based metal oxides, In—Yb—Zn-based metal oxides, In—Lu—Zn-based metal oxides; binary metal oxides such as In—Zn-based metal oxides, Sn—Zn-based metal oxides, Al—Zn-based metal oxides, Zn—Mg-based metal oxides, Sn—Mg-based metal oxides, In—Mg-based metal oxides, In—Ga-based metal oxides; and metal oxides containing indium, tin, zinc, or the like.

For the above-listed metal oxides, In—Ga—Zn-based metal oxides, for example, are oxides whose main components are In, Ga, and Zn, and there is no particular limitation on the ratio of In:Ga:Zn. In addition, In—Ga—Zn-based metal oxides may contain metal elements other than In, Ga, and Zn.

In—Ga—Zn-based metal oxides, in particular, can have a sufficiently high resistance when no electric field is applied thereto and thus can have a sufficiently low off-state current. Further, In—Ga—Zn-based metal oxides have high field-effect mobility and are therefore a preferable semiconductor material for semiconductor devices. The drain breakdown voltage depends on the thickness of the oxide semiconductor layer. For this reason, it is preferable to set the thickness of the oxide semiconductor layer large in order to increase the drain breakdown voltage, and it is possible to select the film thickness suitable for a desired drain breakdown voltage. In view of this, the thicknesses of the oxide semiconductor films 105a and 105b are preferably in the range of 30 nm to 10 μm.

The transistor in one embodiment of the present invention is a vertical transistor so that the transistor can achieve both its size reduction and a large thickness of its oxide semiconductor layer, thereby having a high drain breakdown voltage.

The drain-breakdown-voltage of a transistor using an oxide semiconductor will be now described.

When the electric field in the semiconductor reaches a certain threshold value, impact ionization occurs, and carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have a kinetic energy that is greater than or equal to the band gap of the semiconductor. It is known that the impact ionization coefficient that shows probability of impact ionization has correlation with the band gap and that the impact ionization is unlikely to occur as the band gap is increased.

Since the band gap of the oxide semiconductor is about 3.15 eV, which is larger than the band gap of silicon, i.e., about 1.12 eV, the avalanche breakdown is unlikely to occur. Therefore, a transistor using an oxide semiconductor has a high drain breakdown voltage, and an exponential sudden increase of on-state current is unlikely to occur when a high electric field is applied.

Next, hot-carrier degradation of a transistor using an oxide semiconductor will be described.

The hot-carrier degradation means deterioration of transistor characteristics, e.g., shift in the threshold voltage or gate leakage current, which is caused as follows: electrons that are accelerated to be rapid are injected in the vicinity of a drain in a channel into a gate insulating film and become fixed electric charge or form trap levels at the interface between the gate insulating film and the oxide semiconductor. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and the number of electrons that are accelerated to be so rapid as to go over a barrier to the gate insulating film is increased. However, the oxide semiconductor in this embodiment has a wide band gap; therefore, the avalanche breakdown is unlikely to occur and resistance to the hot-carrier degradation is higher than that of silicon. For this reason, it can be said that a transistor using the oxide semiconductor in this specification has a high drain breakdown voltage. Therefore, such a transistor is suitable for an insulated-gate field-effect transistor (IGFET) or a power MOSFET.

The oxide semiconductor films 105a and 105b are preferably purified by sufficient removal of impurities such as hydrogen and sufficient supply of oxygen. Specifically, the hydrogen concentration in each of the oxide semiconductor films 105a and 105b is $5\times10^{19}$ atoms/cm$^3$ or less, preferably $5\times10^{18}$ atoms/cm$^3$ or less, more preferably $5\times10^{17}$ atoms/cm$^3$ or less. Note that the hydrogen concentration in each of the oxide semiconductor films 105a and 105b is measured by secondary ion mass spectrometry (SIMS). The oxide semiconductor films 105a and 105b purified by a sufficient reduction in hydrogen concentration, in which defect levels in the energy gap due to oxygen deficiency are reduced as a result of sufficient supply of oxygen, has a carrier density, which depends on donors such as hydrogen, of $1\times10^{10}$/cm$^3$ to $1\times10^{13}$/cm$^3$. The off-state current (per unit channel width (1 μm) here) at room temperature (25° C.) is 100 zA (1 zA (zeptoampere) is $1\times10^{-21}$ A) or less, preferably 10 zA or less. Use of such an oxide semiconductor that is made to be intrinsic (i-type) or substantially intrinsic provides excellent off-state current characteristics.

The threshold voltage of the vertical transistor can be shifted in the positive direction by increasing the ratio of the thickness of the oxide semiconductor films 105a and 105b to the in-plane length of each side of the oxide semiconductor films 105a and 105b, which is in contact with part of an upper surface of the first electrode 103. This may be because a sufficient depletion layer is formed in the oxide semiconductor film by the fact that, seeing section A-B in FIGS. 1A and 1B, each oxide semiconductor film serving as a channel formation region is larger in the thickness direction than in the in-plane direction. In order to form a sufficient depletion layer in the oxide semiconductor film, the thickness of the oxide semiconductor films 105a and 105b is preferably set 9 times or more as large as the in-plane length of each side of the oxide semiconductor films 105a and 105b, which is in contact with a part of the upper surface of the first electrode 103, for example. Note that the thickness of the oxide semiconductor film in this specification corresponds to a perpendicular distance from the first electrode 103 to each of the second electrodes 107a and 107b.

Preferable shapes of the oxide semiconductor films 105a and 105b (the thickness, in particular) change depending on the carrier density, which is due to donors, of the oxide semiconductor films 105a and 105b.

When the oxide semiconductor films 105a and 105b are n-type oxide semiconductor films each having a carrier density, which depends on donors such as hydrogen, of more than $1\times10^{13}$/cm$^3$, particularly of $1\times10^{16}$/cm$^3$ or more, the thickness of the oxide semiconductor films 105a and 105b is preferably set 11 times or more as large as the in-plane length of each side of the oxide semiconductor films 105a and 105b, which is in contact with a part of the upper surface of the first electrode 103.

A transistor having an n-type oxide semiconductor film has excessive carriers, so that the transistor is normally-on. A normally-on transistor can be used, for example, for a start circuit which is included in a circuit generating reference voltage or reference current and used for stable operation of the circuit. In this case, the start circuit can have a simple circuit configuration with fewer elements. Moreover, the threshold voltage of the vertical transistor in this embodiment can be controlled by changing the lengths in the in-plane direction and thickness direction along line A-B in FIGS. 1A and 1B.

Each of the oxide semiconductor films 105a and 105b may be either an amorphous oxide semiconductor film or an oxide semiconductor film including a crystalline region.

The second electrodes 107a and 107b which are over the oxide semiconductor films 105a and 105b and each of which serves as the other of the source electrode and the drain electrode may be a conductive film of any of the metal elements and alloy that have been described as materials for the first electrode 103.

The gate insulating film 109 in contact with the first electrode 103, the oxide semiconductor films 105a and 105b, and the second electrodes 107a and 107b can be an oxide insulating film which is formed using a silicon oxide, a silicon nitride, a silicon oxynitride, an aluminum oxide or the like. Preferably, portions of the gate insulating film 109 which are in contact with the oxide semiconductor films 105a and 105b contain oxygen. More preferably, a silicon oxide film containing oxygen that is equivalent to or exceeds the stoichiometric proportion is used as the gate insulating film 109. Use of the silicon oxide films allows oxygen to be supplied from the silicon oxide films to the oxide semiconductor films 105a and 105b by heat treatment included in the process for manufacturing the transistor, thereby making the transistor characteristics favorable.

Use of a high-k material such as hafnium oxide, yttrium oxide, hafnium silicate (HfSi$_x$O$_y$ (where x>0 and y>0)), hafnium silicate to which nitrogen is added (HfSi$_x$O$_y$N$_z$ (where x>0, y>0 and z>0)), or hafnium aluminate (HfAl$_x$O$_y$ (where x>0 and y>0)) can increase the physical thickness of the gate insulating film while maintaining the capacitance of the gate insulating film, thereby reducing the gate leakage current. The gate insulating film 109 may be either a single layer or a stacked layer. Note that the gate insulating film 109 preferably has a thickness ranging from 50 nm to 500 nm.

The third electrode 111 which faces the oxide semiconductor films 105a and 105b with the gate insulating film 109 interposed therebetween and serves as a gate electrode can be a conductive film of any of the metal elements and alloy that have been described as materials for the first electrode 103.

The interlayer insulating film 113 can be an insulating film of the material that has been described as material for the gate insulating film 109.

The wiring 115 can be a conductive film of any of the metal elements and alloy that have been described as materials for the first electrode 103.

Next, the method for manufacturing the transistor will be described with reference to FIGS. 4A and 4B and FIGS. 5A and 5B.

A base insulating film (not illustrated) is formed over the substrate 101. Through this process, impurities in a glass substrate can be prevented from entering the transistors to be formed.

The base insulating film can be formed by sputtering, CVD, coating, or the like.

Note that when the base insulating film is formed by sputtering, the base insulating film is preferably formed while hydrogen, water, a hydroxyl group, hydride, or the like remaining in a treatment chamber is removed. This is for preventing hydrogen, water, a hydroxyl group, hydride, or the like from being contained in the base insulating film. It is preferable to use an entrapment vacuum pump in order to remove hydrogen, water, a hydroxyl group, hydride, or the like remaining in the treatment chamber. As an entrapment vacuum pump, for example, a cryopump, an ion pump, or a titanium sublimation pump is preferably used. The evacuation unit may be a turbo pump provided with a cold trap. Hydrogen, water, a hydroxyl group, hydride, or the like is removed from the treatment chamber which is evacuated with a cryopump; thus, when the insulating film is formed in the treatment chamber, the concentration of impurities contained in the base insulating film can be reduced.

As a sputtering gas used for forming the base insulating film, a high-purity gas is preferably used in which impurities such as hydrogen, water, a hydroxyl group, or hydride are reduced to such a level that the impurity concentration is represented by the unit "ppm" or "ppb".

In this embodiment, a silicon oxide film is formed as the base insulating film over the substrate 101 in such a manner that the substrate 101 is introduced into the treatment chamber, a sputtering gas containing oxygen from which hydrogen, water, a hydroxyl group, hydride, or the like is removed is introduced into the treatment chamber, and a silicon target is used. Note that when the base insulating film is formed, the substrate 101 may be heated.

For example, the silicon oxide film is formed by RF sputtering under the following conditions: quartz (preferably, synthesized quartz) is used, the substrate temperature is 108° C., the distance between the target and the substrate (the T-S distance) is 60 mm, the pressure is 0.4 Pa, the power of the high frequency power source is 1.5 kW, and the atmosphere contains oxygen and argon (the flow ratio of oxygen to argon is 1:1 (each flow rate is 25 sccm)). The film thickness is preferably 100 nm. Note that instead of a quartz (preferably, synthesized quartz) target, a silicon target can be used. As the sputtering gas, oxygen or a mixed gas of oxygen and argon is used.

When the base insulating film is formed using a stacked structure, the base insulating film is, for example, preferably a silicon nitride film formed using a silicon target and a sputtering gas containing high-purity nitrogen, from which hydrogen, water, a hydroxyl group, hydride, or the like is removed, between the silicon oxide film and the substrate.

In the case where a silicon nitride film and a silicon oxide film are stacked as the base insulating film, the silicon nitride film and the silicon oxide film can be formed in the same treatment chamber with the use of a common silicon target. First, the silicon nitride film is formed in such a manner that a sputtering gas containing nitrogen is introduced and a silicon target mounted on the treatment chamber is used. Then, the silicon oxide film is formed in such a manner that the gas is switched to a sputtering gas containing oxygen and the same silicon target is used. The silicon nitride film and the silicon oxide film can be formed in succession without being exposed to the air; therefore, impurities such as hydrogen, water, a hydroxyl group, or hydride can be prevented from being attached to the surface of the silicon nitride film.

Next, the first electrode 103 is formed over the substrate 101 on which the base insulating film is formed. The first electrode 103 can be formed in such a manner that a conductive film is formed over the substrate 101 by sputtering which is physical vapor deposition (PVD), vacuum deposition, or chemical vapor deposition (CVD), a resist mask is formed over the conductive film by a first photolithography step, and the conductive film is etched using the resist mask. Alternatively, the first electrode 103 is formed without any photolithography step but in such a manner that a mask is formed by printing or inkjet method, and the conductive film is etched using the mask, resulting in a reduction in the number of steps. Note that the edges of the first electrode 103 are preferably tapered to allow a gate insulating film subsequently formed to have a higher coverage. When a photolithography step is employed, the edges can be tapered by performing etching while removing the resist mask. Note that in this specification, unless otherwise specified, an etching process includes a step of removing a resist mask.

Here, a conductive film to be the first electrode 103 which is a stack of a 50-nm-thick titanium film overlaid by a 100-nm-thick aluminum film overlaid by a 50-nm-thick titanium film is formed by sputtering, and then etched using the resist mask formed by the first photolithography step to form the first electrode 103.

Figure 4A:
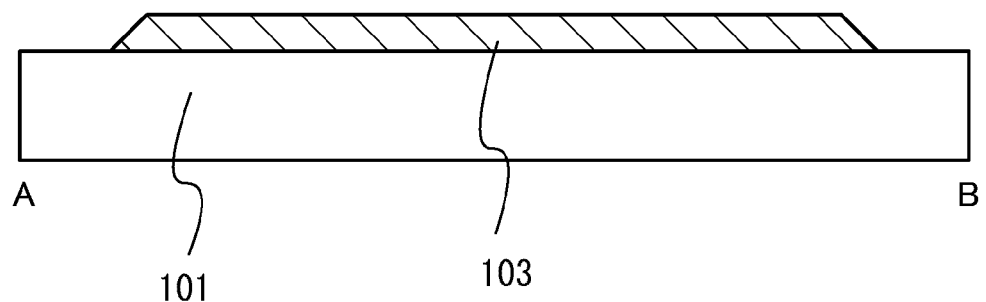
FIGS. 4A and 4B illustrate a method for manufacturing the vertical transistor.

The structure obtained through the steps up to here is illustrated in FIG. 4A.

Next, an oxide semiconductor film is formed over the first electrode 103. Further, a conductive film to be the second electrodes 107a and 107b are formed over the formed oxide semiconductor film.

Specifically, the oxide semiconductor film is formed over the first electrode 103 by sputtering, molecular beam epitaxy, atomic layer deposition, pulsed laser deposition, coating, printing, or the like. Next, the conductive film is formed over the oxide semiconductor film. Here, the oxide semiconductor film is formed by sputtering.

As pretreatment, it is preferable that the substrate 101 formed through the steps up to and including the step of FIG. 4A be preheated in a preheating chamber of a sputtering apparatus and impurities such as hydrogen, water, a hydroxyl group, or hydride attached to the substrate 101 be eliminated and removed so that hydrogen is contained in the oxide semiconductor film as little as possible. As an exhaustion unit provided in the preheating chamber, a cryopump is preferable. Note that this preheating treatment can be omitted. This preheating step may be performed on the substrate 101 over which the first electrode 103 has not been formed.

Note that before the oxide semiconductor film is formed by sputtering, reverse sputtering in which plasma is generated by introduction of an argon gas is preferably performed so that dust or an oxide film which is attached to a surface of the first electrode 103 is removed, in which case the resistance at an interface between the first electrode 103 and the oxide semiconductor film can be reduced. The reverse sputtering refers to a method of modifying a surface of a substrate by applying a voltage to the substrate using an RF power source in an argon atmosphere to form plasma in a vicinity of the substrate. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

Here, the oxide semiconductor film is formed by sputtering using an In—Ga—Zn-based metal oxide target. The oxide semiconductor film can be formed by sputtering in a rare gas (typically, argon) atmosphere, an oxygen atmosphere, or an atmosphere including a rare gas (typically, argon) and oxygen. When sputtering is employed, a target containing $SiO_2$ at 2 wt % to 10 wt %, inclusive may be used.

As a sputtering gas used for forming the oxide semiconductor film, a high-purity gas is preferably used in which impurities such as hydrogen, water, a hydroxyl group, or hydride are reduced to such a level that the impurity concentration is represented by the unit "ppm" or "ppb".

As a target for forming the oxide semiconductor film by sputtering, a target of metal oxide which contains zinc oxide as its main component can be used. As another example of a metal oxide target, an oxide semiconductor target containing In, Ga, and Zn (in a composition ratio, $In_2O_3:Ga_2O_3:ZnO=1$:

1:1 [molar ratio], In:Ga:Zn=1:1:0.5 [atomic ratio]) can be used. As the oxide semiconductor target containing In, Ga, and Zn, a target having a composition ratio of In:Ga:Zn=1:1:1 [atomic ratio] or In:Ga:Zn=1:1:2 [atomic ratio] can also be used. Furthermore, the filling rate of the oxide semiconductor target is 90% to 100%, preferably 95% to 99.9%. An oxide semiconductor film which is formed using the oxide semiconductor target with high filling rate is dense.

The oxide semiconductor film is formed over the first electrode 103 in such a manner that a sputtering gas from which hydrogen, water, hydroxyl groups, hydride, or the like is removed is introduced into the treatment chamber and a metal oxide is used as a target while the substrate is held in the treatment chamber held in a reduced-pressure state and moisture remaining in the treatment chamber is removed. It is preferable to use an entrapment vacuum pump in order to remove hydrogen, water, a hydroxyl group, hydride, or the like remaining in the treatment chamber. As the entrapment vacuum pump, a cryopump, an ion pump, or a titanium sublimation pump is preferably used. The evacuation unit may be a turbo pump provided with a cold trap. Hydrogen, water, a hydroxy group, hydride, or the like (more preferably, including a compound containing a carbon atom) is exhausted from the treatment chamber with the use of a cryopump. Therefore, the concentration of impurities contained in the oxide semiconductor film formed in this chamber can be reduced. The oxide semiconductor film may be formed while the substrate is heated.

Examples of the film formation conditions of the oxide semiconductor film here are as follows: the substrate temperature is room temperature, the distance between the substrate and the target is 110 mm; the pressure is 0.4 Pa; the direct current (DC) power source is 0.5 kW; and the atmosphere contains oxygen and argon (oxygen flow rate of 15 sccm, argon flow rate of 30 sccm). Note that a pulse direct current (DC) power supply is preferable because it can reduce dust and make the film thickness uniform. The thickness of the oxide semiconductor film is 5 μm. Note that in this embodiment, the best thickness of the oxide semiconductor film changes depending on a material for a metal oxide used. In view of this, the thickness of the oxide semiconductor film is selected in accordance with the material as appropriate.

When an n-type oxide semiconductor film having a carrier density of higher than $1.0\times10^{16}/cm^3$ is used as the oxide semiconductor film used in the vertical transistor, the oxide semiconductor film is formed using hydrogen in addition to oxygen and argon that have been described as gases used for forming the oxide semiconductor film.

A conductive film to be the second electrodes 107a and 107b are formed in a similar manner to the first electrode 103. Here, the conductive film to be the second electrodes 107a and 107b is a stack of a 50-nm-thick titanium film overlaid by a 100-nm-thick aluminum film overlaid by a 50-nm-thick titanium film which are formed by sputtering.

Next, a resist mask is formed over the conductive film through a second photolithography step, the conductive film to be the second electrodes 107a and 107b and the oxide semiconductor film to be the oxide semiconductor films 105a and 105b are etched using the resist mask, thereby forming the second electrodes 107a and 107b and the oxide semiconductor films 105a and 105b. Note that by forming the second electrodes 107a and 107b and the oxide semiconductor films 105a and 105b by using a mask formed by printing, inkjet method, or the like instead of the resist mask formed by the photolithography step, the number of steps can be reduced. When a photolithography step is employed, such etching enables their edges to be tapered by performing etching while removing the resist mask, thereby allowing an interlayer insulating film subsequently formed to have a higher coverage.

Note that the etching of the conductive films and the oxide semiconductor films here may employ dry etching or wet etching, or both. In order to form the second electrodes 107a and 107b and oxide semiconductor films 105a and 105b having desired shapes, the etching conditions (etchant, etching time, temperature, and the like) are adjusted as appropriate in accordance with the material for the second electrodes 107a and 107b and the material for the oxide semiconductor films 105a and 105b.

Further, subsequent first heat treatment makes the oxide semiconductor of the oxide semiconductor films 105a and 105b to be one that is intrinsic (i-type) or substantially intrinsic and has a carrier density, which depends on donors such as hydrogen, of less than $1\times10^{13}/cm^3$. Note that the thickness of the oxide semiconductor films 105a and 105b is preferably set 9 times or more as large as the in-plane length of each side of the oxide semiconductor films 105a and 105b, which is in contact with a part of the upper surface of the first electrode 103, for example. Therefore, the in-plane length of each side of the etched oxide semiconductor films 105a and 105b, which is in contact with a part of the upper surface of the first electrode 103 is adjusted as appropriate so that it may be one-ninth of the thickness of the final oxide semiconductor films or less.

When dry etching is employed, in case etching rate for the conductive film to be the second electrodes 107a and 107b and the oxide semiconductor film and that for the first electrode 103 are different, an etching condition in which etching rate for the first electrode 103 is low and etching rate for the conductive film to be the second electrodes 107a and 107b and the oxide semiconductor film is high, is selected. Alternatively, the conductive film to be the second electrodes 107a and 107b is etched under an etching condition in which etching rate for the oxide semiconductor film is low and etching rate for the conductive film to be the second electrodes 107a and 107b is high, and then an etching condition in which etching rate for the first electrode 103 is low and etching rate for the oxide semiconductor film is high is selected. In other words, dry etching is performed under an etching condition that provides a difference between etching rates in the first electrode 103, the oxide semiconductor film, and the conductive film. Here, the oxide semiconductor films 105a and 105b and the second electrodes 107a and 107b are formed by dry etching.

As an etching gas used for dry etching of the oxide semiconductor film, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As dry etching, a parallel plate RIE (reactive ion etching) or an ICP (inductively coupled plasma) etching can be used. In order to etch the film into a desired shape, the etching conditions (the amount of electric power applied to a coil-shaped electrode, the amount of electric power applied to an electrode on a substrate side, the temperature of the electrode on the substrate side, and the like) is adjusted as appropriate.

As an etchant used for wet etching of the oxide semiconductor film, a mixed solution of phosphoric acid, acetic acid, and nitric acid, an ammonia hydrogen peroxide mixture (hydrogen peroxide water at 31 wt %: ammonia water at 28 wt %: water=5:2:2), or the like can be used. In addition, ITO07N (produced by KANTO CHEMICAL CO., INC.) may also be used.

The etchant left after the wet etching is removed together with the materials removed by the etching in the step of cleaning. The waste liquid including the etchant and the removed material may be purified and then material contained therein may be reused. When a material such as indium contained in the oxide semiconductor film is collected from the waste liquid after the etching and reused, the resources can be efficiently used and the cost can be reduced.

Figure 4B:
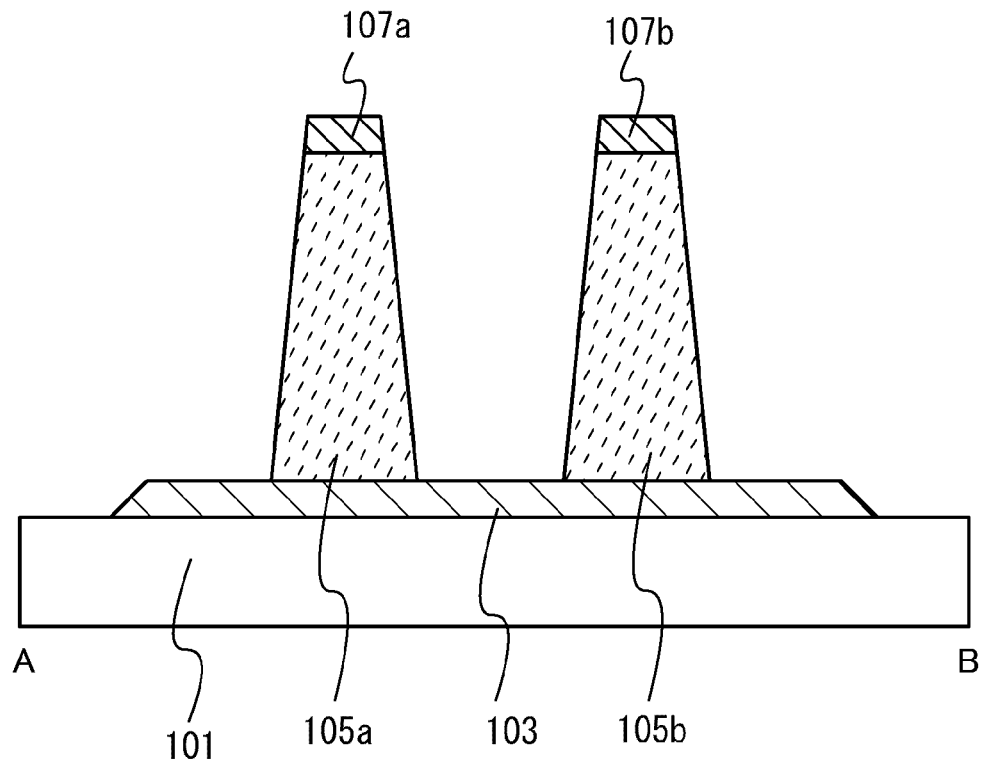

The structure obtained through the steps up to here is illustrated in FIG. 4B.

Next, in this embodiment, a first heat treatment is performed. The temperature of the first heat treatment is higher than or equal to 400° C. and lower than the strain point of the substrate, preferably higher than or equal to 400° C. and lower than or equal to 750° C. Here, the substrate is introduced into an electric furnace that is a kind of heat treatment apparatus and heat treatment is performed on the oxide semiconductor film at 450° C. in an atmosphere of an inert gas such as nitrogen or a rare gas for one hour. Then, the oxide semiconductor film is not exposed to air; consequently, hydrogen, water, a hydroxyl group, hydride, or the like can be prevented from entering the oxide semiconductor film. That is, at least one of dehydration and dehydrogenation of the oxide semiconductor films 105a and 105b can be performed by this first heat treatment.

Note that it is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon introduced into a heat treatment apparatus is preferably 6N (99.9999%) or higher, more preferably 7N (99.99999%) or higher (that is, the concentration of the impurities is 1 ppm or lower, preferably 0.1 ppm or lower).

The first heat treatment on the oxide semiconductor films 105a and 105b may be performed before the second photolithography step. In this case, the substrate is taken out from the heat apparatus after the first heat treatment, and then a photolithography step is performed. Alternatively, the first heat treatment on the oxide semiconductor films 105a and 105b may be performed before the stacked conductive film to be the second electrodes 107a and 107b is formed.

Next, the gate insulating film 109 is formed. The gate insulating film 109 can be formed by sputtering which is PVD, vacuum deposition, or CVD. The transistor in one embodiment of the present invention is a vertical transistor, and thus has an oxide semiconductor film serving as a channel formation region which is longer in the thickness direction. For this reason, the gate insulating film 109 formed by CVD has a higher coverage than that formed by PVD such as sputtering.

Here, a 200-nm-thick silicon oxide film ($SiO_x$ (x>0)) to be the gate insulating film 109 is formed by plasma CVD, which is a kind of CVD. The gate insulating film is either a single layer or a stacked layer, i.e., a silicon nitride film ($SiN_y$ (y>0)) may be formed over the above-stated silicon oxide film ($SiO_x$ (x>0)) by plasma CVD.

Plasma CVD is a method for forming a film by supplying a deposition gas to be raw materials to a reaction chamber of a plasma CVD apparatus to employ plasma energy.

As the plasma CVD apparatus, a capacitively coupled high-frequency plasma CVD apparatus using a high-frequency power source, an inductively coupled high-frequency plasma CVD apparatus, a microwave plasma CVD apparatus (an electron cyclotron resonant plasma CVD apparatus) which has magnetron and a dielectric substance that are microwave generation sources and generates plasma using the microwave, and a helicon wave plasma CVD apparatus are given. In plasma CVD of this specification, a CVD apparatus in which glow discharge plasma is utilized for the formation of the film can be used as appropriate. Plasma CVD can be performed while the substrate is heated.

It is preferable that the gate insulating film 109 contain little impurities such as hydrogen and water. As an example, impurities such as hydrogen and water can be reduced by, in the formation of the silicon oxide film by plasma CVD, removing impurities such as hydrogen and water which remain in the reaction chamber of the plasma CVD apparatus or which are adsorbed to the inner wall of the reaction chamber, and forming the layer while heating the inner wall of the reaction chamber.

In the case of forming the gate insulating film 109 by sputtering, a silicon target or a quartz target is used as a target, and oxygen or a mixed gas of oxygen and argon is used as a sputtering gas.

Note that in order to remove impurities such as hydrogen, water, a hydroxyl group, or hydride (also referred to as a hydrogen compound) which may exist at the interface between each of the oxide semiconductor films 105a and 105b and the gate insulating film 109, a halogen element (e.g., fluorine or chlorine) may be contained in the gate insulating film 109, or a halogen element may be contained in the oxide semiconductor films 105a and 105b by plasma treatment in a gas atmosphere containing a halogen element in a state where the oxide semiconductor films 105a and 105b are exposed. When the gate insulating film contains a halogen element, the halogen element concentration in the gate insulating film is preferably approximately $5 \times 10^{18}$ cm$^{-3}$ to $1 \times 10^{20}$ cm$^{-3}$.

As described above, in the case where a halogen element is contained in the oxide semiconductor films 105a and 105b or at the interface between each of the oxide semiconductor films 105a and 105b and the gate insulating film 109 and where the gate insulating film 109 is an oxide insulating film, a surface of the oxide insulating film which is not in contact with the oxide semiconductor films 105a and 105b is preferably covered with a nitrogen insulating film. That is, a silicon nitride film or the like may be provided on the oxide insulating film which is in contact with the oxide semiconductor films 105a and 105b. With such a structure, impurities such as hydrogen, water, hydroxy group, and hydride can be prevented from entering the oxide insulating film.

A second heat treatment is preferably performed after the formation of the gate insulating film 109. The conditions of the second heat treatment are the same as those of the first heat treatment. Note that the second heat treatment is preferably performed in a state where the oxide semiconductor films 105a and 105b are covered with an oxide insulating film (e.g., the gate insulating film 109). The first heat treatment and the second heat treatment results in the oxide semiconductor films 105a and 105b whose hydrogen concentration is reduced and which are purified and made intrinsic (i-type) or substantially intrinsic.

Next, the third electrode 111 serving as a gate electrode is formed. A conductive film to be the third electrode 111 is formed in a similar manner to the first electrode 103. Owing to the coverage of the conductive film formed by sputtering, a portion of the conductive film which overlaps with the first electrode 103 and the second electrodes 107a and 107b is thicker than a portion of the conductive film which faces the sidewalls of the oxide semiconductor films 105a and 105b with the gate insulating film 109 interposed therebetween.

However, the portion of the conductive film which overlaps with the first electrode 103 and the second electrodes 107a and 107b is removed completely by a third photolithography step and an etching step. The film thickness of the third electrode 111 is decided as appropriate in consideration of this. Here, a 300-nm-thick titanium film is formed by sputtering.

A resist mask is formed by the third photolithography step, and a conductive film is formed using the resist mask and then is subjected to etching. A method in which a resist mask is formed in a portion where the conductive film should be left as the third electrode 111 enables the formation of the following different transistors: a transistor like one in FIG. 1B in which the third electrode 111 is only between the oxide semiconductor films 105a and 105b; and a transistor like one in FIG. 2B in which the third electrode 111 faces all the sidewalls of the oxide semiconductor films 105a and 105b with the gate insulating film 109 interposed therebetween. Here, the resist mask is formed so that the third electrode 111 may be formed only between the oxide semiconductor films 105a and 105b, and then etching is performed. Note that the details of the etching step are similar to those of the etching step performed on the first electrode 103 and the second electrodes 107a and 107b.

Removal of the resist mask by the etching leaves the most upper surface of the conductive film to be the third electrode 111 which is in a position higher than that of the most upper surface of the gate insulating film 109 overlapping with the second electrodes 107a and 107b. Considering the coverage of the interlayer insulating film 113 at the time of the formation of the interlayer insulating film 113, it is preferable to remove projected portions at the surface of the conductive film to be the third electrode 111 by planarization such as etchback, CMP (chemical mechanical polishing), and SOG (spin on glass). Here, the most upper surface of the conductive film to be the third electrode 111 and the most upper surface of the gate insulating film 109 overlapping with the second electrodes 107a and 107b are planarized by etchback. Thus, the third electrode 111 is formed.

Figure 5A:
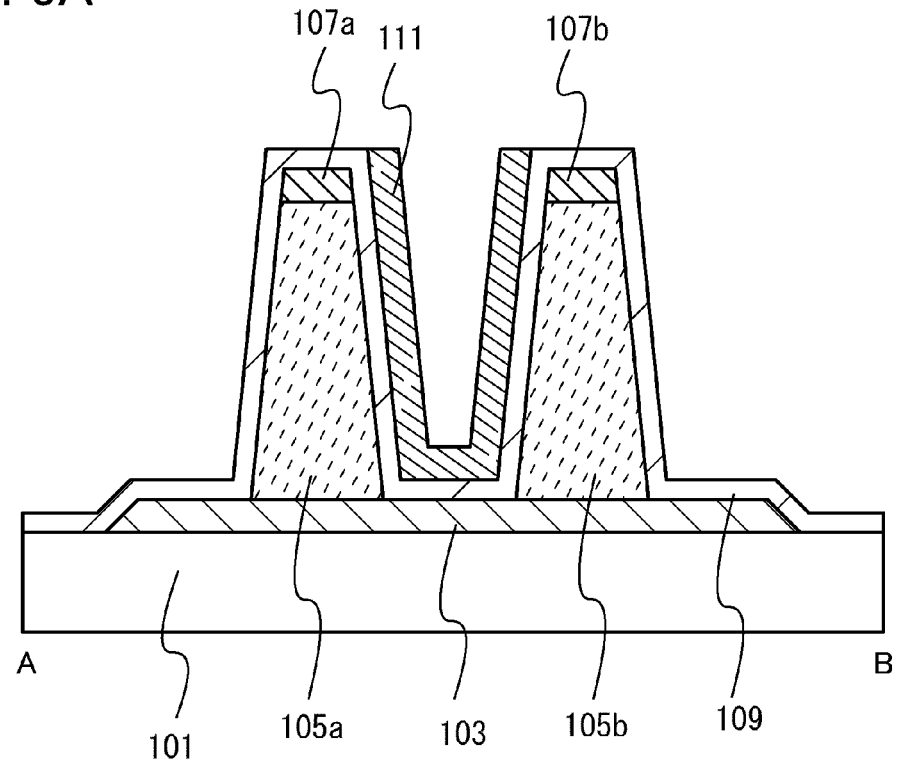
FIGS. 5A and 5B illustrate the method for manufacturing the vertical transistor.

The structure obtained through the steps up to here is illustrated in FIG. 5A.

Next, the interlayer insulating film 113 is formed over the gate insulating film 109 and the third electrode 111. The interlayer insulating film 113 can be formed in a similar manner to the gate insulating film 109. Here, 100-nm-thick silicon oxide film is formed by CVD.

Then, a resist mask is formed by a fourth photolithography step, and part of the gate insulating film 109 and interlayer insulating film 113 is etched using the resist mask, thereby exposing part of the second electrodes 107a and 107b. The etching step is performed in a similar manner to the above etching step. The etching step employs dry etching, for example.

Finally, the wiring 115 is formed in such a manner that a conductive film to be the wiring 115 is formed, a resist mask is formed by a fifth photolithography step, and the conductive film is subjected to etching using the resist mask. The conductive film to be the wiring 115 can be formed in a similar manner to the first electrode 103. Here, a 300-nm-thick titanium film is formed by sputtering.

Figure 5B:
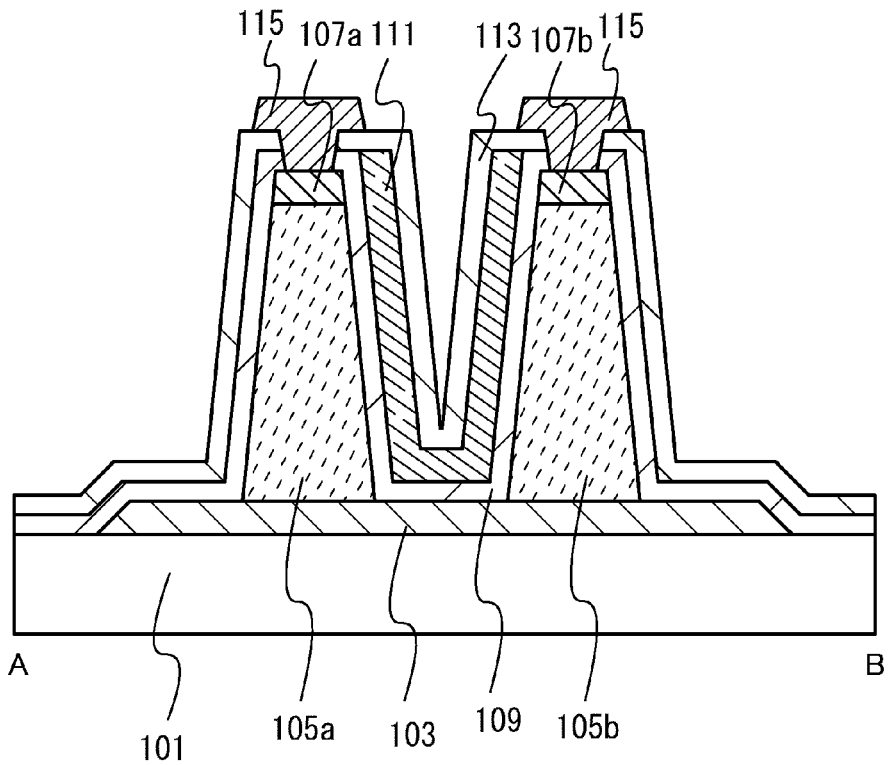

The structure obtained through the steps up to here is illustrated in FIG. 5B.

As in the case of the transistor 500 in FIGS. 3A and 3B, in the case where a plurality of oxide semiconductor films to be channel formation regions is provided, the plurality of oxide semiconductor films can be formed in the same manner as that for manufacturing the above-stated transistor except for a step of forming a desired resist mask for the formation of the plurality of oxide semiconductor films by a photolithography step after the formation of the conductive film to be the second electrodes 107a and 107b and performing etching using the resist mask.

The other process for manufacturing the transistor 500 is similar to that for manufacturing the transistor 100 or the transistor 200. Through these steps, the transistor 500 can be manufactured (see FIGS. 3A and 3B).

Thus, the transistor in one embodiment of the present invention can be manufactured. Note that this embodiment can be implemented in combination with any of the structures described in other embodiments, as appropriate.

Embodiment 2

In this embodiment, a transistor having a configuration different from that of the transistor of Embodiment 1 will be described.

Figure 6A:
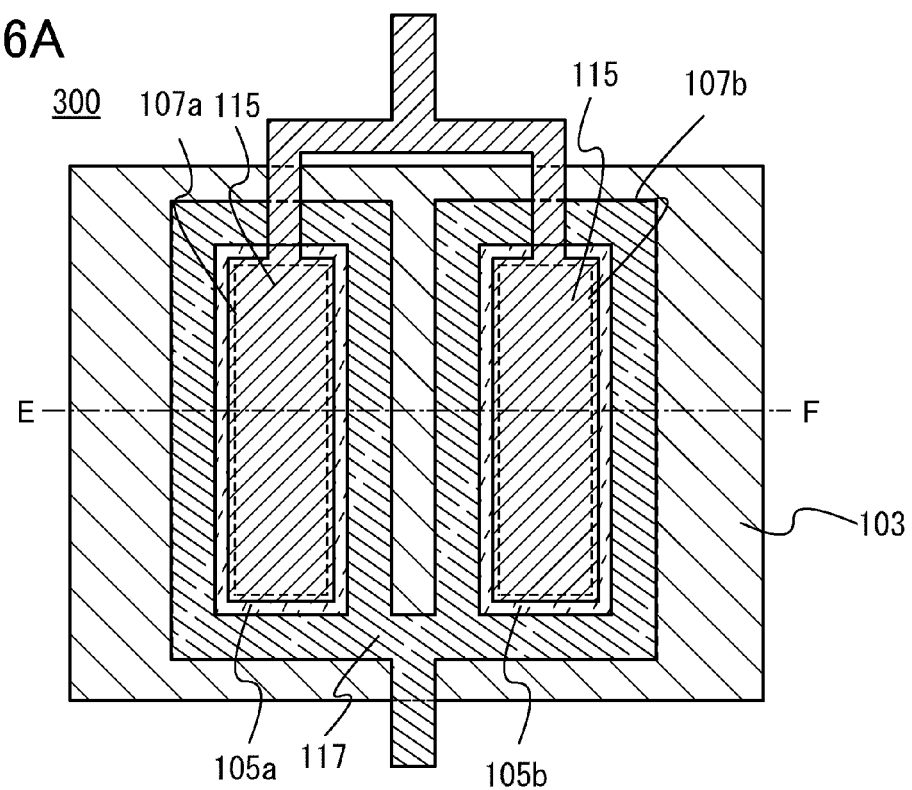
FIG. 6A is a top view of a vertical transistor and FIG. 6B is a cross-sectional view thereof.
Figure 6B:
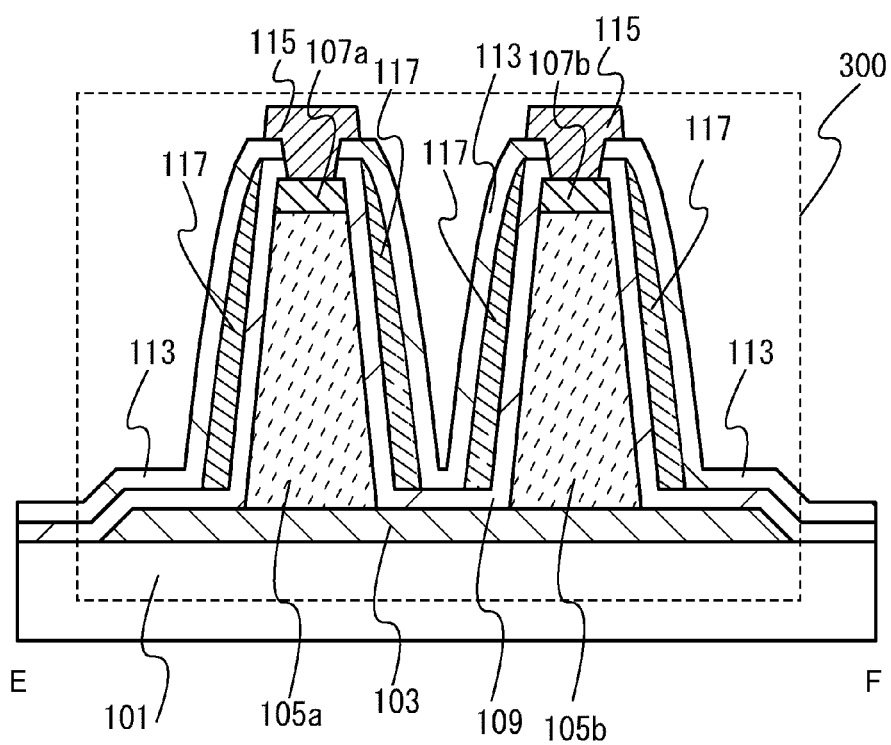
Figure 7A:
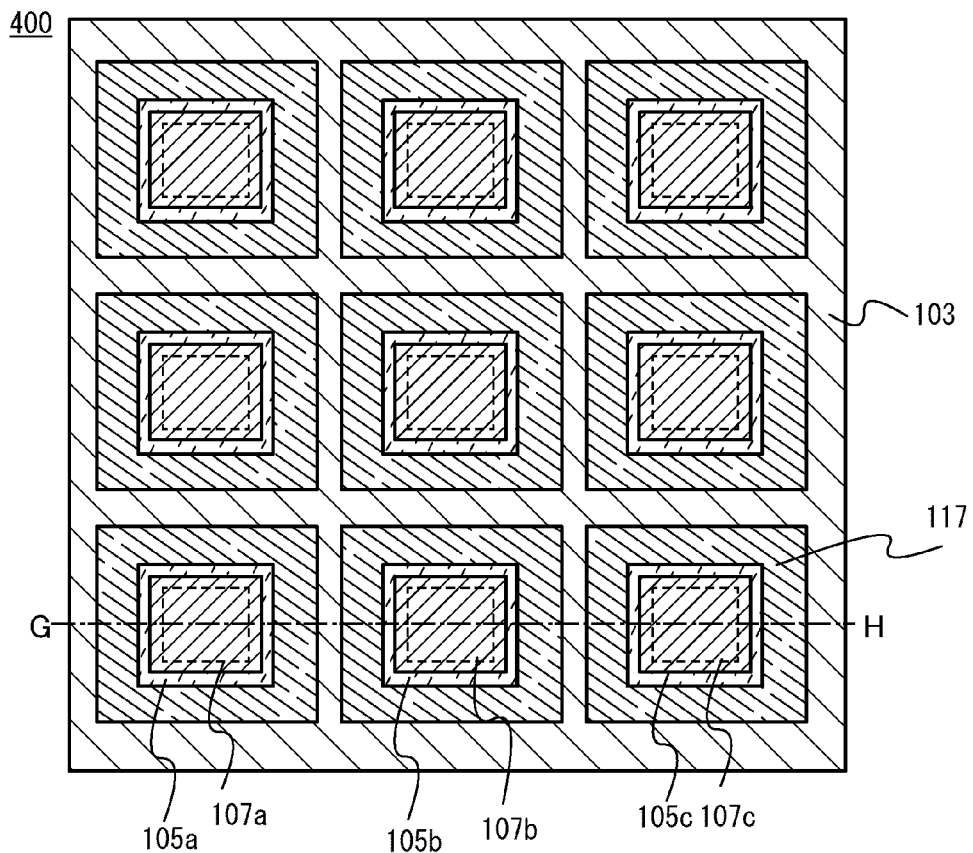
FIG. 7A is a top view of a vertical transistor and FIG. 7B is a cross-sectional view thereof.
Figure 7B:
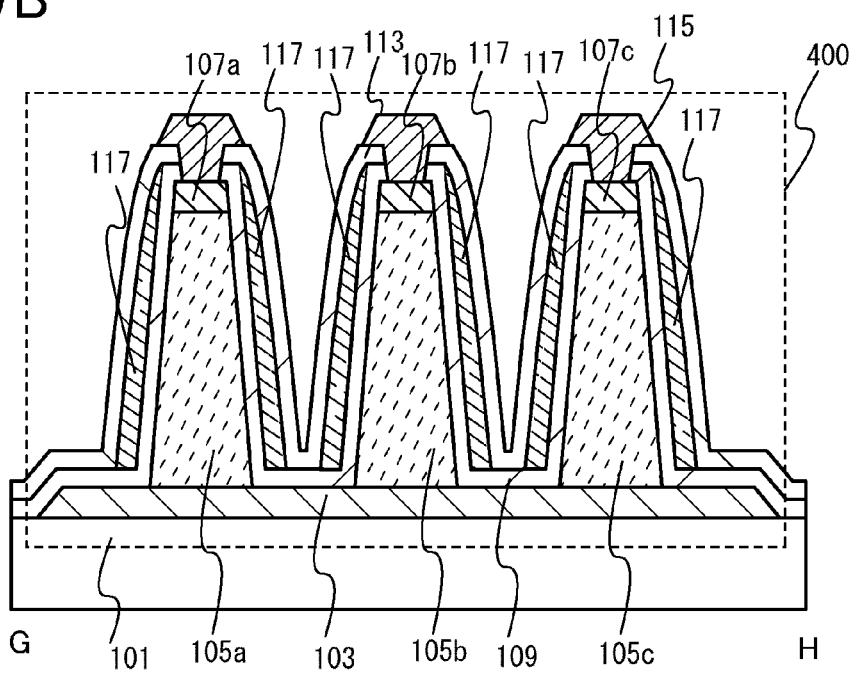

FIG. 6A is a top view of a transistor 300, and FIG. 6B is a cross-sectional view taken along line E-F in FIG. 6A. FIG. 7A is a top view of a transistor 400, and FIG. 7B is a cross-sectional view taken along line G-H in FIG. 7A.

Seeing FIG. 2B and FIG. 6B, the third electrode 111 of the transistor 200 and the third electrode 117 of the transistor 300 which serve as gate electrodes are different in shape. The cross-section of the third electrode 111 of the transistor 200 in FIG. 2B has a rectangular shape, whereas the cross-section of the third electrode 117 of the transistor 300 in FIG. 6B has a triangular shape or an almost triangular shape including a curve. Here, the cross-section of the third electrode 117 is an almost triangular shape including a curve.

For the transistor 300, between the oxide semiconductor films 105a and 105b, the third electrode 117 faces the sidewalls of the oxide semiconductor films 105a and 105b with the gate insulating film 109 interposed therebetween. Therefore, the third electrode 117 of the transistor 300 is the same as the third electrode 111 of the transistor 200 in that they are formed so as to enclose all the sidewalls of the oxide semiconductor films 105a and 105b, but is different from the third electrode 111 of the transistor 200 in that its third electrode 117 present between the oxide semiconductor films 105a and 105b has a gap. Further for the transistor 300, the third electrode 117 needs to be unified by bonding technique so that the same potential may be applied to all the portions of the third electrode 117 facing all the sidewalls of the oxide semiconductor films 105a and 105b with the gate insulating film 109 interposed therebetween. Note that FIG. 6A does not show the substrate 101, the gate insulating film 109, and the interlayer insulating film 113 for convenience.

Unlike the manufacture of the transistor 100 and transistor 200 of Embodiment 1, the manufacture of the transistor 300 does not need a resist mask to process the third electrode 117, thereby reducing the number of photolithography steps and manufacturing cost. Moreover, the third electrode 117 faces, without fail, all the sidewalls of the oxide semiconductor films 105a and 105b with the gate insulating film 109 interposed therebetween, which enables efficient application of electric field to the oxide semiconductor films 105a and 105b serving as channel formation regions, producing favorable transistor characteristics.

A transistor 400 has the third electrode 117 which is different in shape from those of the transistors 100, 200, and 500 as shown in FIG. 7B and includes the plurality of oxide semiconductor films 105a, 105b, and 105c.

The transistor 400 includes a plurality of oxide semiconductor films. Thus, for improvement in productivity, it is preferable that the third electrode 117 of the transistor 400 serving as a gate electrode be processed without a resist mask as in the transistor 300 and have a curved surface. For this reason, the third electrode 117 of the transistor 400 has a closed-loop structure as shown in FIG. 7A. As in the description of the transistor 500, in order to apply the same potential to all the portions of the third electrode 117 having a closed-loop structure, wiring (not illustrated) other than the first electrode, the second electrode, and the third electrode is provided to electrically connect all the portions of the third electrode 117 to each other. Except for this, the transistor 400 is similar to the transistors of Embodiment 1. Note that FIG. 7A does not illustrate the substrate 101, the gate insulating film 109, the interlayer insulating film 113, and the wiring 115 for convenience.

As in Embodiment 1, the threshold voltage of each of the transistor 300 and the transistor 400 can be shifted in the positive direction by increasing the ratio of the thickness of the oxide semiconductor films to the in-plane length of each side of the oxide semiconductor films which is in contact with part of an upper surface of the first electrode 103. When the oxide semiconductor films are intrinsic (i-type) or substantially intrinsic, the thickness of the oxide semiconductor films is preferably set 9 times or more as large as the in-plane length of each side of the oxide semiconductor films, which is in contact with a part of the upper surface of the first electrode 103, for example.

Preferable shapes of the oxide semiconductor films 105a and 105b (the thickness, in particular) change depending on the carrier concentrations, which are due to donors, of the oxide semiconductor films 105a and 105b. When the oxide semiconductor films are of n-type conductivity, the thickness of the oxide semiconductor films is preferably set 11 times or more as large as the in-plane length of each side of the oxide semiconductor films which is in contact with a part of the upper surface of the first electrode 103, for example.

Like the transistor 100, the transistor 300, and the transistor 400 can easily be reduced in size. Further, they can have a high drain current without reducing the operating speed when having a plurality of oxide semiconductor films or when having oxide semiconductor films disposed in parallel.

Next, a method for manufacturing the transistor 300 and the transistor 400 will be described.

The process for manufacturing the transistor 300 is the same as part of the process described in Embodiment 1 which starts by the step of forming the first electrode 103 over the substrate 101 and ends with the step of forming the second electrodes 107a and 107b as shown in FIGS. 4A and 4B.

Figure 8A:
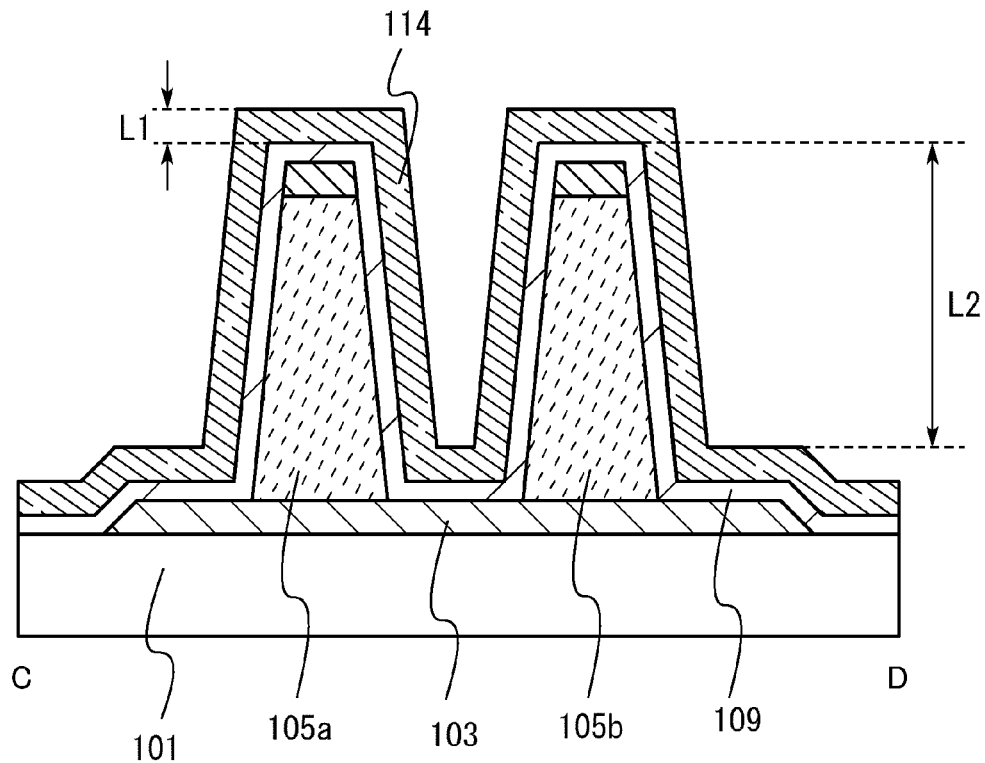
FIGS. 8A and 8B illustrate the method for manufacturing the vertical transistor.

The gate insulating film 109 is formed over the first electrode 103, the oxide semiconductor films 105a and 105b, and the second electrodes 107a and 107b in the manner described in Embodiment 1. Then, a conductive film 114 to be the third electrode 117 is formed in the manner described in Embodiment 1. The structure obtained through the steps up to here is illustrated in FIG. 8A.

Figure 8B:
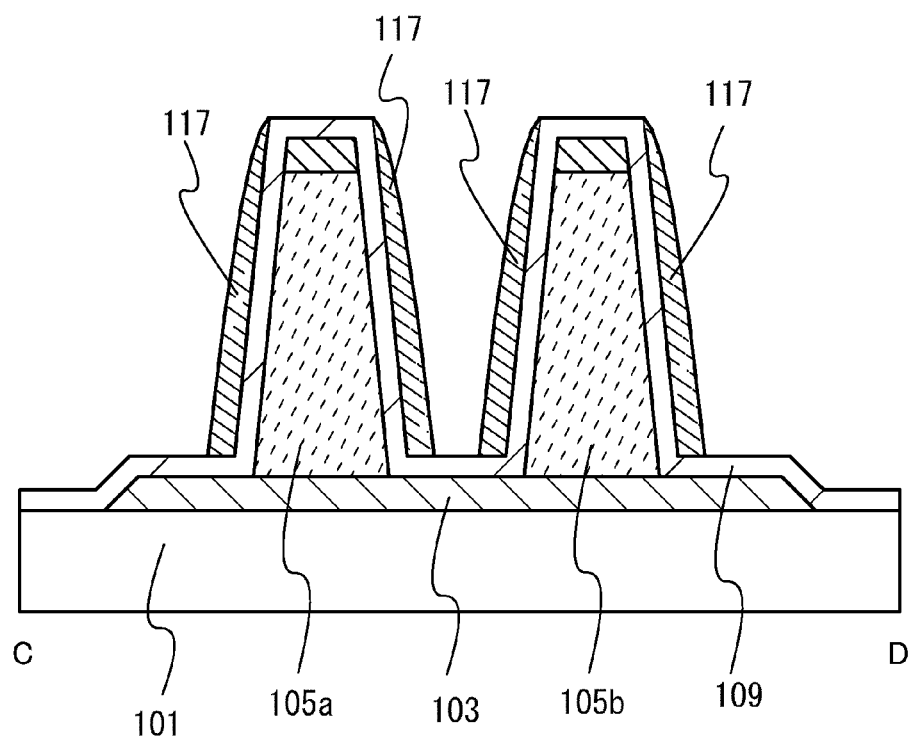

After the formation of the conductive film 114, etching is performed without a photolithography step, i.e., without the formation of a resist mask. The etching in this step employs dry etching which is anisotropic etch. The etching conditions (etching time, temperature, and the like) are adjusted as appropriate according to the material. The etching is continued, considering the ratio between etch rates in the gate insulating film 109 and the conductive film 114, until at least portions of the conductive film 114 which overlap with the second electrodes 107a and 107b (thickness L1 in FIG. 8A) are completely etched and part of the gate insulating film 109 is exposed. This etching step produces the third electrode 117 which has a curved surface as shown in FIG. 8B. This is because even when anisotropic etch is performed to etch the conductive film 114 by the thickness L1, the anisotropic etch does not etch the film by the thickness L2 for the reason that each of the portions of the conductive film 114 which face the oxide semiconductor films 105a and 105b with the gate insulating film 109 (thickness L2 in FIG. 8A) is thicker than each of the portions of the conductive film 114 which overlap with the second electrodes 107a and 107b (the thickness L1 in FIG. 8A). Consequently, the conductive film 114 is etched more lightly as its height decreases from the height of the second electrodes 107a and 107b to the height of the first electrode 103. Thus, the third electrode 117 is so processed as to have a curved surface as shown in FIG. 8B.

Next, the interlayer insulating film 113 and the wiring 115 are formed in the manner described in Embodiment 1.

Through the above steps, the transistor 300 can be manufactured (see FIG. 6B).

For the transistor 400, the plurality of oxide semiconductor films can be formed in the same manner as that for manufacturing the transistor 300 except for a step of forming a desired resist mask for the formation of the plurality of oxide semiconductor films by a photolithography step after the formation of the conductive film to be the second electrodes and performing etching using the resist mask.

The other process for manufacturing the transistor 400 is similar to that for manufacturing the transistor 300. Through these steps, the transistor 400 can be manufactured (see FIG. 7B for example).

Thus, the transistor in one embodiment of the present invention can be manufactured. Note that this embodiment can be implemented in combination with any of the structures described in other embodiments, as appropriate.

Embodiment 3

An embodiment which uses a circuit including the transistor in Embodiments 1 and 2 will be described.

The transistor in Embodiments 1 and 2 has a high drain current and high drain breakdown voltage. Thus, the transistor can be used in the following examples: a DC-DC converter circuit; a motor control circuit; an audio amplifier; a logic circuit; a switch circuit; and a high-frequency linear amplifier used for a home electrical appliance to which an inverter technique is applied, such as an air conditioner, a refrigerator, a rice cooker, or a solar photovoltaic system; a battery-driven portable information terminal device, such as a laptop personal computer (PC); a power amplifier device such as a stroboscope; an electric vehicle; and the like.

Here, an example of a solar photovoltaic system including an inverter formed using the transistor in Embodiments 1 and 2 will be described with reference to FIG. 9. Note that an example of a structure of a solar photovoltaic system installed on a house and the like is shown here.

Figure 9:
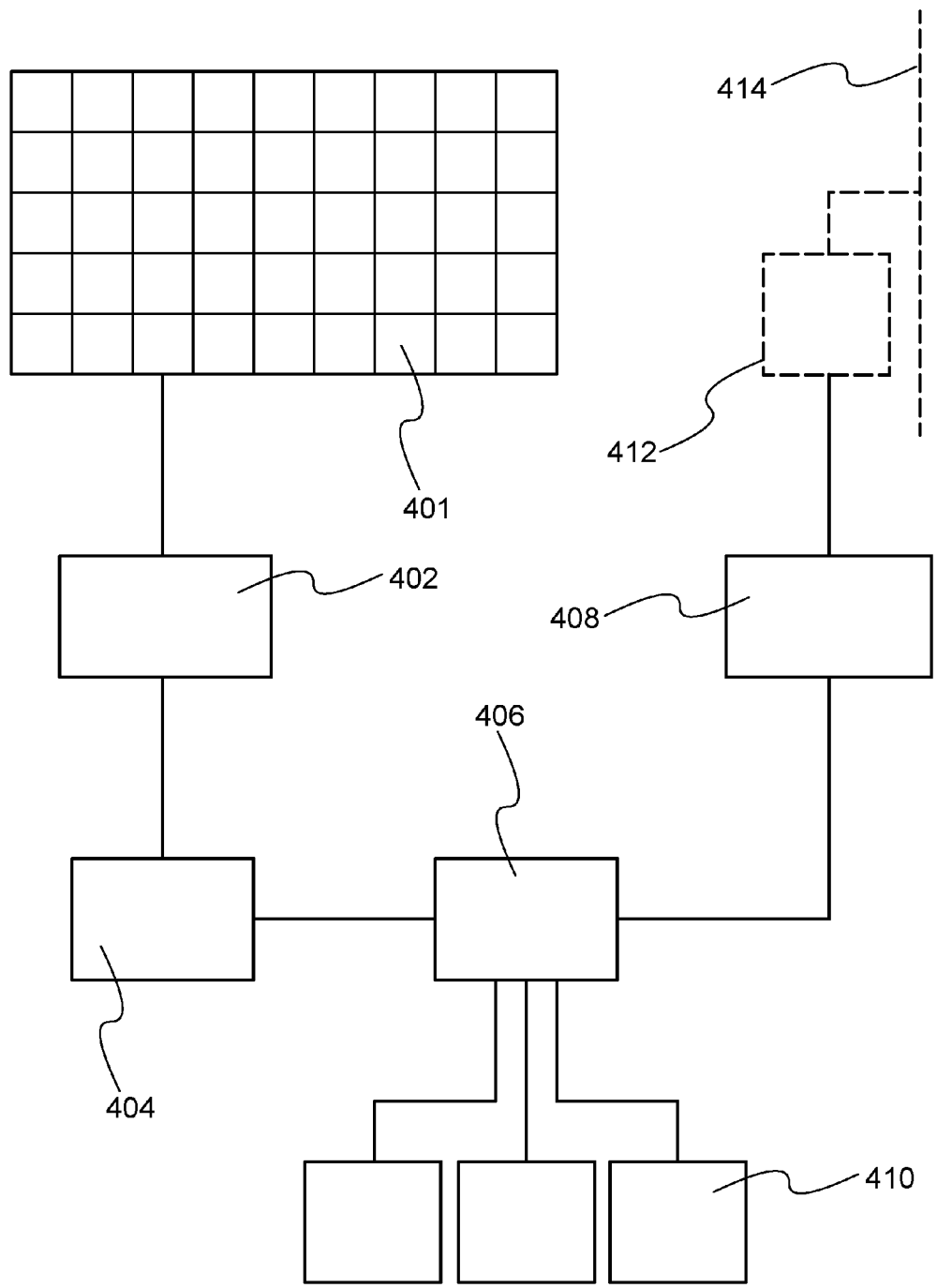
FIG. 9 illustrates an example of a solar power generation system.

A residential solar photovoltaic system illustrated in FIG. 9 is a system in which a method for supplying electric power is changed in accordance with a state of solar power generation. When solar power generation is performed, for example, when the sun shines, electric power generated by solar power generation is consumed inside the house, and surplus electric power is supplied to an electric grid 414 that is led from an electric power company. On the other hand, at night time or at the time of rain when electric power is insufficient, electric power is supplied from the electric grid 414 and is consumed inside the house.

The residential solar photovoltaic system illustrated in FIG. 9 includes a solar cell panel 401 which converts sunlight into electric power (direct current power), an inverter 404 which converts the electric power from direct current into alternating current, and the like. Alternating current power output from the inverter 404 is used as electric power for operating various types of electric devices 410.

Surplus electric power is supplied to outside the house through the electric grid 414. In other words, electric power can be sold using this system. A DC switch 402 is provided to select connection or disconnection between the solar cell panel 401 and the inverter 404. An AC switch 408 is provided to select connection or disconnection between a distribution board 406 and a transformer 412 connected to the electric grid 414.

When the transistor of the disclosed invention is applied to the above inverter, a highly reliable and inexpensive solar photovoltaic system can be realized.

The structures, methods, and the like described in this embodiment can be combined with any of the other embodiments, as appropriate.

Example 1

Example 1 shows the results of calculation for the transistor in the above embodiment using a two-dimensional device simulator.

Figure 10A:
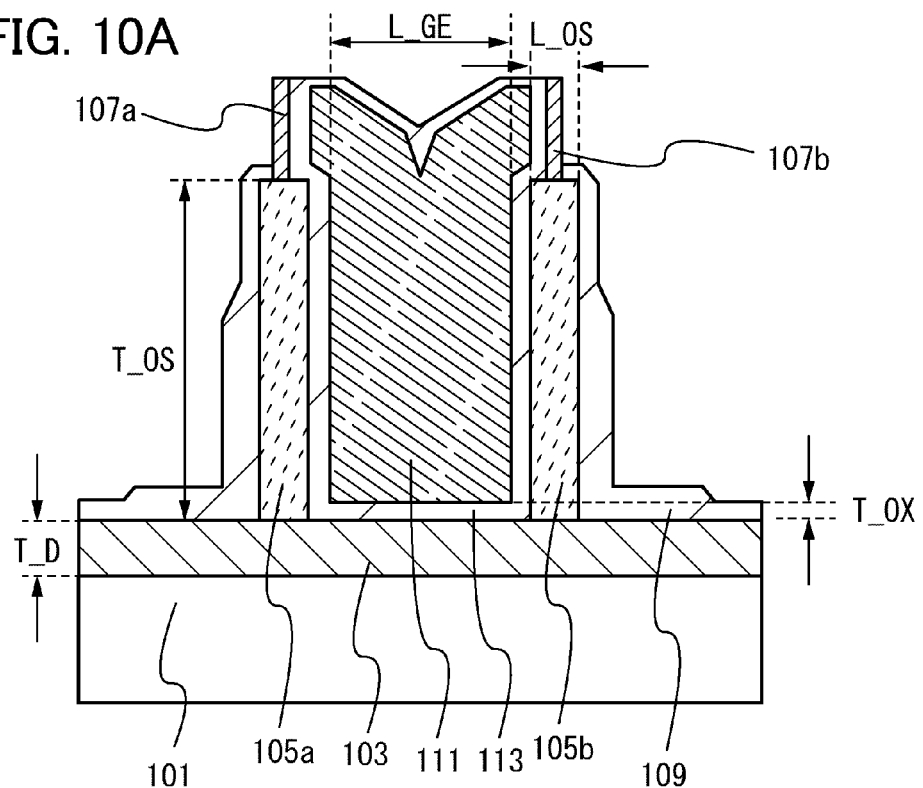
FIGS. 10A and 10B are cross-sectional views of transistors used as calculation models.

Example 1 employed a device simulator "ATLAS" developed by Silvaco Data Systems Inc. FIG. 10A illustrates the structure of a transistor used for the actual calculation. The structure of a transistor used for the calculation is a simplified version of the structure illustrated in FIG. 1A. Portions that are common between the transistor structure illustrated in FIG. 10A and that illustrated in FIG. 1A have the same hatch pattern.

In the calculation, the elements in the transistor structure illustrated in FIG. 10A were in the following conditions: the thickness of the first electrode 103 serving as a drain electrode (T_D) is 0.75 μm; the thickness of the gate insulating film 109 provided between the first electrode 103 and the third electrode 111 serving as a gate electrode (T_OX) is 0.2 μm; the thickness of the oxide semiconductor films 105a and 105b serving as channel formation regions (T_OS) is 5 μm; the length of the oxide semiconductor films 105a and 105b which corresponds to the in-plane length of each side of the oxide semiconductor films 105a and 105b, which is in contact with a part of the upper surface of the first electrode 103 (L_OS) in Embodiment 1 is 0.55 μm; and the length of the third electrode 111 (L_GE) is 2 μm. The channel length of the transistor is T_OS. The channel width of the transistor (W_OS), which is not illustrated, was 100 μm.

Figure 10B:
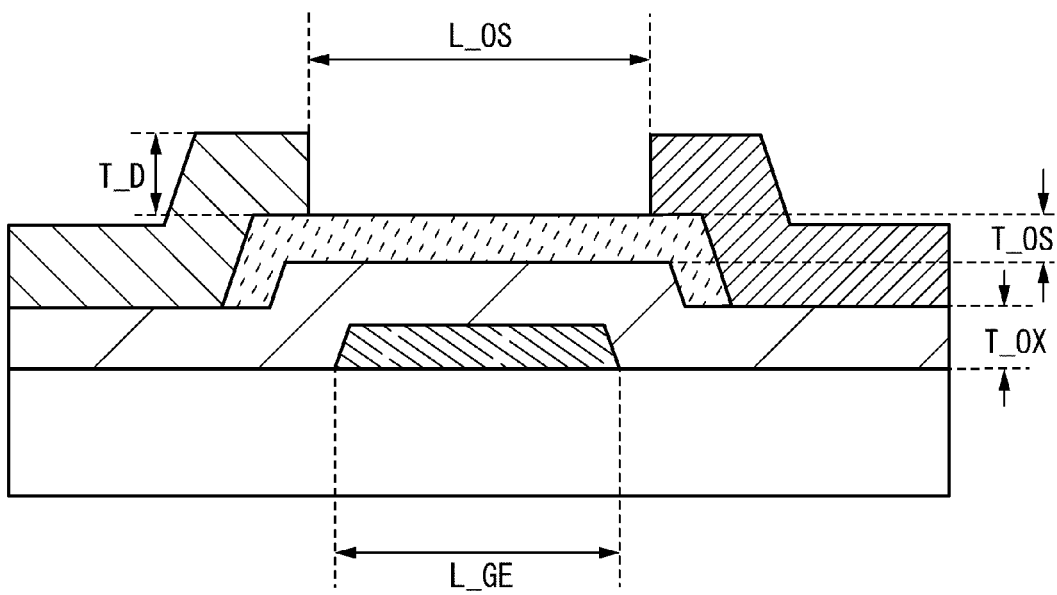

For comparison, another calculation for a lateral transistor whose channel length (T_OS) is 5 μm and whose channel width is 200 μm was also performed (see FIG. 10B).

This calculation employed the following conditions: the oxide semiconductor film is intrinsic (i-type) or substantially intrinsic; the donor density (Nd) is $1 \times 10^{13}/cm^3$; the dielectric constant of the gate insulating film is 4.0; the dielectric constant of the oxide semiconductor film is 15.0; the mobility of the oxide semiconductor film is 7.0 $cm^{21}/Vs$; the work function of the oxide semiconductor film is 4.3 eV; the bandgap of the oxide semiconductor film is 3.15 eV; the effective density of states in the conduction band at 300 K is $5.0 \times 10^{18}/cm^3$; the effective density of states in the valence band at 300 K is $5.0 \times 10^{18}/cm^3$; the work function of the first electrode 103 serving as one of a source electrode and a drain electrode is 4.3 eV; the work function of the second electrodes 107a and 107b serving as the other of the drain electrode and the source electrode is 4.3 eV; and the work function of the third electrode 111 serving as a gate electrode is 4.6 eV.

Figure 11:
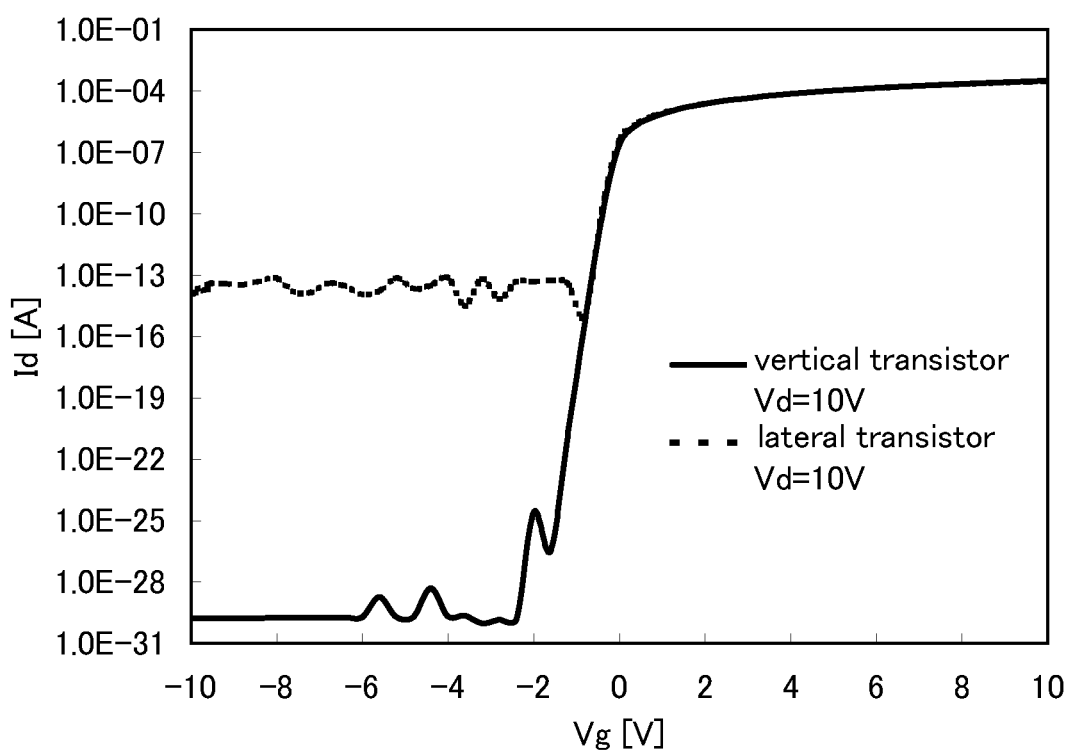
FIG. 11 shows the results of calculation by a device simulator.

FIG. 11 shows the gate voltage (Vg)-drain current (Id) characteristics obtained by the calculation. Comparison between the vertical transistor and the lateral transistor shows that the vertical transistor in FIG. 10A has a higher on/off ratio than the lateral transistor in FIG. 10B. Note that the Vg-Id curve in FIG. 11 indicates Vg-Id characteristics obtained when the voltage between the source electrode and the drain electrode (which is also referred to as drain voltage and abbreviated to Vd) is 10 V.

This is because the vertical transistor has a smaller area where the source electrode (the second electrode 107a) is in physical contact with the oxide semiconductor film 105a and a smaller area where the source electrode (the second electrode 107b) is in physical contact with the oxide semiconductor film 105b than the lateral transistor, and thus has a reduced off-state current.

Next, the calculation results obtained when the oxide semiconductor film is of n-type conductivity will be shown. The transistor used for this calculation and its parameters were the same as those used for the above-stated calculation except that the width of the oxide semiconductor films 105a and 105b (L_OS) is 0.45 μm and the donor density (Nd) is $1.0 \times 10^{16}/cm^3$. A comparable transistor was the lateral transistor in FIG. 10B.

Figure 12:
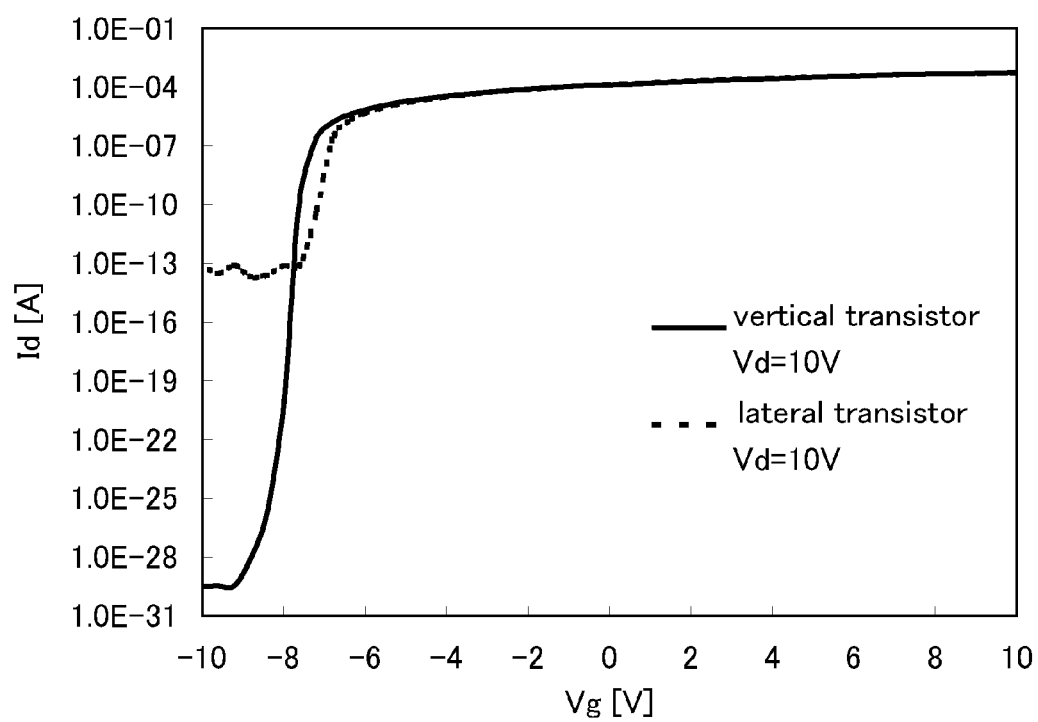
FIG. 12 shows the results of calculation by a device simulator.

FIG. 12 shows Vg-Id characteristics obtained from the calculation. It was shown that even a vertical transistor using an n-type oxide semiconductor film can have a higher on/off ratio than a lateral transistor. Note that the Vg-Id curve shown in FIG. 12 also indicates Vg-Id characteristics obtained when the drain voltage is 10 V.

Thus, it was shown that the vertical transistor in one embodiment of the present invention can have a high on/off ratio when the thickness of the oxide semiconductor films 105a and 105b (T_OS) is set larger than the length of the oxide semiconductor films 105a and 105b (L_OS).

Example 2

Example 2 will show calculation results different from those in Example 1. In Example 2, the transistor in FIG. 10A was calculated for its gate voltage-drain current characteristics with different variations of the ratio of the thickness of the oxide semiconductor films 105a and 105b (T_OS) to the length of the oxide semiconductor films 105a and 105b (L_OS). Example 2 also employed a device simulator "ATLAS" developed by Silvaco Data Systems Inc.

Type 1 where T_OS/L_OS=3, Type 2 where T_OS/L_OS=6, Type 3 where T_OS/L_OS=9, and Type 4 where T_OS/L_OS=12 were used. Note that the other parameters of the transistor structure in FIG. 10A are similar to those in Example 1.

Figure 13:
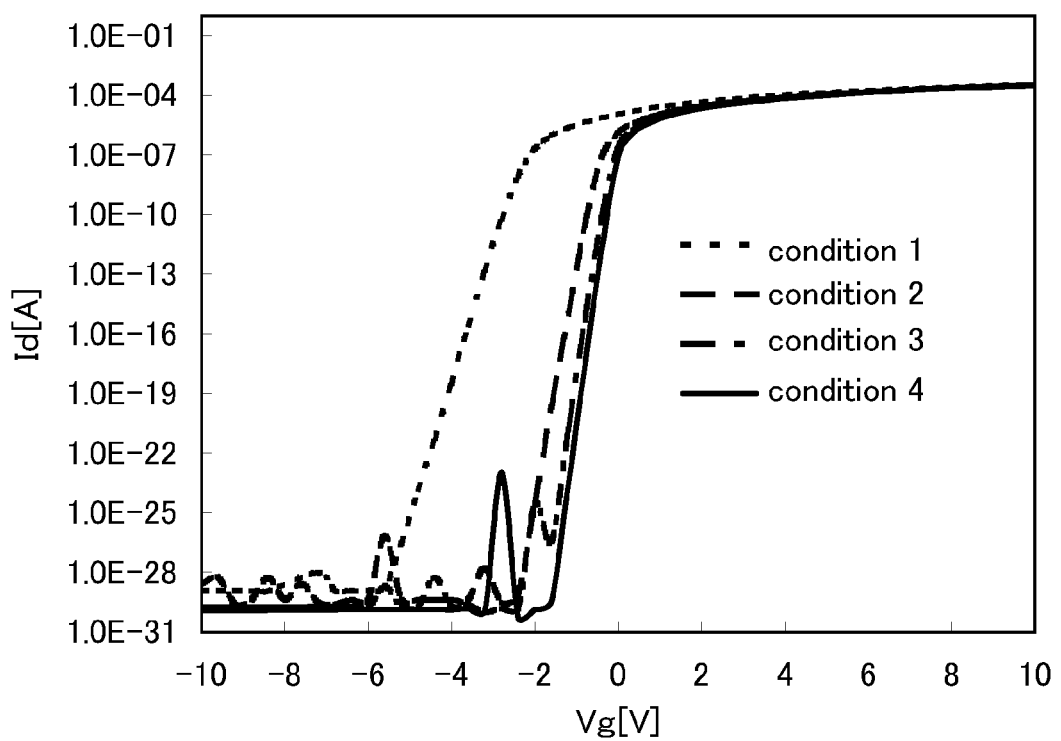
FIG. 13 shows the results of calculation by a device simulator.

FIG. 13 shows Vg-Id characteristics obtained from the calculation. Note that Vg-Id characteristics in FIG. 13 are also ones obtained when the drain voltage is 10 V.

FIG. 13 shows that as the ratio of T_OS to L_OS increases, the threshold voltage shifts in the positive direction. In other words, the threshold voltage of the vertical transistor in one embodiment of the present invention can be shifted in the positive direction (i.e., the vertical transistor can be made normally off) when the ratio of the thickness of the oxide semiconductor films 105a and 105b to the in-plane length of each side of the oxide semiconductor films 105a and 105b which is in contact with a part of the upper surface of the first electrode 103 is increased.

This application is based on Japanese Patent Application serial no. 2010-184118 filed with Japan Patent Office on Aug. 19, 2010, the entire contents of which are hereby incorporated by reference.

What is claimed is:

1. A semiconductor device comprising:
   a first electrode;
   a first oxide semiconductor film and a second oxide semiconductor film, which are in contact with the first electrode;
   a second electrode overlapping with the first electrode with the first oxide semiconductor film and the second oxide semiconductor film interposed therebetween;
   a gate insulating film covering at least the first electrode, the first oxide semiconductor film and the second oxide semiconductor film; and
   a third electrode which is in contact with the gate insulating film and is formed at least between the first oxide semiconductor film and the second oxide semiconductor film,
   wherein a portion of the gate insulating film is in contact with the first electrode.

2. The semiconductor device according to claim 1, wherein the third electrode has a closed-loop structure.

3. The semiconductor device according to claim 1, wherein the third electrode faces all sidewalls of the first oxide semiconductor film and the second oxide semiconductor film with the gate insulating film interposed therebetween.

4. The semiconductor device according to claim 1,
   wherein the first electrode serves as one of a source electrode and a drain electrode,
   wherein the second electrode serves as the other of the source electrode and the drain electrode, and
   wherein the third electrode serves as a gate electrode.

5. The semiconductor device according to claim 1, wherein when a donor density of the first oxide semiconductor film and the second oxide semiconductor film is $1.0 \times 10^{13}/cm^3$ or less, a thickness of each of the first oxide semiconductor film and the second oxide semiconductor film is set 9 times or more as large as a length of each side of the first oxide semiconductor film and the second oxide semiconductor film, which is in contact with the first electrode.

6. The semiconductor device according to claim 1, wherein when a donor density of the first oxide semiconductor film and the second oxide semiconductor film is more than $1.0 \times 10^{13}/cm^3$, a thickness of each of the first oxide semiconductor film and the second oxide semiconductor film is set 11 times or more as large as a length of each side of the first oxide semiconductor film and the second oxide semiconductor film, which is in contact with the first electrode.

7. A semiconductor device comprising:
   a first electrode;
   a first oxide semiconductor film and a second oxide semiconductor film, which are in contact with the first electrode;
   a second electrode overlapping with the first electrode with the first oxide semiconductor film and the second oxide semiconductor film interposed therebetween;
   a gate insulating film covering at least the first electrode, the first oxide semiconductor film and the second oxide semiconductor film; and
   a third electrode which is in contact with the gate insulating film and is formed at least between the first oxide semiconductor film and the second oxide semiconductor film,
   wherein a thickness of each of the first oxide semiconductor film and the second oxide semiconductor film is larger than a length of each side of the first oxide semiconductor film and the second oxide semiconductor film, which is in contact with the first electrode, and
   wherein a portion of the gate insulating film is in contact with the first electrode.

8. The semiconductor device according to claim 7, wherein the third electrode has a closed-loop structure.

9. The semiconductor device according to claim 7, wherein the third electrode faces all sidewalls of the first oxide semiconductor film and the second oxide semiconductor film with the gate insulating film interposed therebetween.

10. The semiconductor device according to claim 7,
    wherein the first electrode serves as one of a source electrode and a drain electrode,
    wherein the second electrode serves as the other of the source electrode and the drain electrode, and
    wherein the third electrode serves as a gate electrode.

11. The semiconductor device according to claim 7, wherein when a donor density of the first oxide semiconductor film and the second oxide semiconductor film is $1.0 \times 10^{13}/cm^3$ or less, the thickness of each of the first oxide semiconductor film and the second oxide semiconductor film is set 9 times or more as large as the length of each side of the first oxide semiconductor film and the second oxide semiconductor film, which is in contact with the first electrode.

12. The semiconductor device according to claim 7, wherein when a donor density of the first oxide semiconductor film and the second oxide semiconductor film is more than $1.0 \times 10^{13}/cm^3$, the thickness of each of the first oxide semiconductor film and the second oxide semiconductor film is set 11 times or more as large as the length of each side of the first oxide semiconductor film and the second oxide semiconductor film, which is in contact with the first electrode.

13. A semiconductor device comprising:
    a first electrode;
    a first oxide semiconductor film, a second oxide semiconductor film and a third oxide semiconductor film, which are in contact with the first electrode;
    a second electrode overlapping with the first electrode with the first oxide semiconductor film, the second oxide semiconductor film and the third oxide semiconductor film interposed therebetween;
    a gate insulating film covering at least the first electrode, the first oxide semiconductor film, the second oxide semiconductor film and the third oxide semiconductor film; and
    a third electrode which is in contact with the gate insulating film and is formed at least between the first oxide semiconductor film and the second oxide semiconductor film and between the second oxide semiconductor film and the third oxide semiconductor film,
    wherein a portion of the gate insulating film is in contact with the first electrode.

14. The semiconductor device according to claim 13, wherein the third electrode has a closed-loop structure.

15. The semiconductor device according to claim 13, wherein the third electrode faces all sidewalls of the first oxide semiconductor film, the second oxide semiconductor film and the third oxide semiconductor film with the gate insulating film interposed therebetween.

16. The semiconductor device according to claim 13,
    wherein the first electrode serves as one of a source electrode and a drain electrode,
    wherein the second electrode serves as the other of the source electrode and the drain electrode, and
    wherein the third electrode serves as a gate electrode.

17. The semiconductor device according to claim 13, wherein when a donor density of the first oxide semiconductor film, the second oxide semiconductor film and the third oxide semiconductor film is $1.0\times10^{13}/cm^3$ or less, a thickness of each of the first oxide semiconductor film, the second oxide semiconductor film and the third oxide semiconductor film is set 9 times or more as large as a length of each side of the first oxide semiconductor film, the second oxide semiconductor film and the third oxide semiconductor film, which is in contact with the first electrode.

18. The semiconductor device according to claim 13, wherein when a donor density of the first oxide semiconductor film, the second oxide semiconductor film and the third oxide semiconductor film is more than $1.0\times10^{13}/cm^3$, a thickness of each of the first oxide semiconductor film, the second oxide semiconductor film and the third oxide semiconductor film is set 11 times or more as large as a length of each side of the first oxide semiconductor film, the second oxide semiconductor film and the third oxide semiconductor film, which is in contact with the first electrode.

19. A semiconductor device comprising:
    a first electrode;
    a first oxide semiconductor film, a second oxide semiconductor film and a third oxide semiconductor film, which are in contact with the first electrode;
    a second electrode overlapping with the first electrode with the first oxide semiconductor film, the second oxide semiconductor film and the third oxide semiconductor film interposed therebetween;
    a gate insulating film covering at least the first electrode, the first oxide semiconductor film, the second oxide semiconductor film and the third oxide semiconductor film; and
    a third electrode which is in contact with the gate insulating film and is formed at least between the first oxide semiconductor film and the second oxide semiconductor film and between the second oxide semiconductor film and the third oxide semiconductor film,
    wherein a thickness of each of the first oxide semiconductor film, the second oxide semiconductor film and the third oxide semiconductor film is larger than a length of each side of the first oxide semiconductor film, the second oxide semiconductor film and the third oxide semiconductor film, which is in contact with the first electrode, and
    wherein a portion of the gate insulating film is in contact with the first electrode.

20. The semiconductor device according to claim 19, wherein the third electrode has a closed-loop structure.

21. The semiconductor device according to claim 19, wherein the third electrode faces all sidewalls of the first oxide semiconductor film, the second oxide semiconductor film and the third oxide semiconductor film with the gate insulating film interposed therebetween.

22. The semiconductor device according to claim 19,
    wherein the first electrode serves as one of a source electrode and a drain electrode,
    wherein the second electrode serves as the other of the source electrode and the drain electrode, and
    wherein the third electrode serves as a gate electrode.

23. The semiconductor device according to claim 19, wherein when a donor density of the first oxide semiconductor film, the second oxide semiconductor film and the third oxide semiconductor film is $1.0\times10^{13}/cm^3$ or less, the thickness of each of the first oxide semiconductor film, the second oxide semiconductor film and the third oxide semiconductor film is set 9 times or more as large as the length of each side of the first oxide semiconductor film, the second oxide semiconductor film and the third oxide semiconductor film, which is in contact with the first electrode.

24. The semiconductor device according to claim 19, wherein when a donor density of the first oxide semiconductor film, the second oxide semiconductor film and the third oxide semiconductor film is more than $1.0\times10^{13}/cm^3$, the thickness of each of the first oxide semiconductor film, the second oxide semiconductor film and the third oxide semiconductor film is set 11 times or more as large as the length of each side of the first oxide semiconductor film, the second oxide semiconductor film and the third oxide semiconductor film, which is in contact with the first electrode.

\* \* \* \* \*